(12) United States Patent
Park et al.

(10) Patent No.: US 9,142,757 B2
(45) Date of Patent: Sep. 22, 2015

(54) MAGNETIC MEMORY DEVICES

(71) Applicant: Samsung Electronics Co., Ltd., Suwon-si (KR)

(72) Inventors: Jongchul Park, Seongnam-si (KR); Hyungjoon Kwon, Seongnam-si (KR); Joonkyu Rhee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/492,419

(22) Filed: Sep. 22, 2014

(65) Prior Publication Data

US 2015/0194595 A1    Jul. 9, 2015

(30) Foreign Application Priority Data

Jan. 8, 2014  (KR) .......................... 10-2014-0002405

(51) Int. Cl.
*H01L 43/02*    (2006.01)
*H01L 43/08*    (2006.01)

(52) U.S. Cl.
CPC ................ *H01L 43/02* (2013.01); *H01L 43/08* (2013.01)

(58) Field of Classification Search
CPC ................. H01L 27/22–27/228; H01L 43/02; H01L 43/08; H01L 43/12
USPC ....................................... 257/421
See application file for complete search history.

(56) References Cited

U.S. PATENT DOCUMENTS

| | | | |
|---|---|---|---|
| 6,521,931 B2 | 2/2003 | Sandhu et al. | |
| 6,989,575 B2 | 1/2006 | Gates et al. | |
| 7,042,758 B2 | 5/2006 | Haneda et al. | |
| 7,078,239 B2 | 7/2006 | Tuttle | |
| 7,092,283 B2 | 8/2006 | Jeong et al. | |
| 7,144,744 B2 | 12/2006 | Lien et al. | |
| 7,372,722 B2 | 5/2008 | Jeong et al. | |
| 7,522,447 B2 | 4/2009 | Jeong et al. | |
| 8,455,965 B2 | 6/2013 | Li et al. | |
| 2005/0078510 A1 | 4/2005 | Jeong et al. | |
| 2011/0269251 A1 | 11/2011 | Kim et al. | |
| 2013/0015540 A1 | 1/2013 | Choi | |
| 2013/0234267 A1* | 9/2013 | Kim et al. | 257/421 |

FOREIGN PATENT DOCUMENTS

KR    100568512    4/2006

* cited by examiner

*Primary Examiner* — Daniel Shook
(74) *Attorney, Agent, or Firm* — Onello & Mello, LLP.

(57) ABSTRACT

A magnetic memory device may include a lower electrode on a substrate, a memory element on the lower electrode, an upper electrode on the memory element, and a protection spacer enclosing a portion of a side surface of the lower electrode and protruding laterally from the side surface of the lower electrode. The protection spacer may have a bottom surface that is positioned at a level higher than that of a bottom surface of the lower electrode.

20 Claims, 29 Drawing Sheets

MAGNETIC MEMORY DEVICES

CROSS-REFERENCE TO RELATED APPLICATIONS

This U.S. non-provisional patent application claims priority under 35 U.S.C. §119 to Korean Patent Application No. 10-2014-0002405, filed on Jan. 8, 2014, in the Korean Intellectual Property Office, the entire contents of which are hereby incorporated by reference.

BACKGROUND OF THE INVENTION

Example embodiments of the inventive concept relate to a magnetic memory device, and in particular, to a magnetic memory device with a magnetic tunnel junction.

To keep up with the trend of higher speeds and lower power consumption, memory devices in electronic appliances need a relatively high read/write speed and relatively low voltage. Magnetic memory devices have been developed to satisfy that need. The magnetic memory devices are spotlighted as next generation memory devices because they have relatively high speed and/or nonvolatile characteristics.

A magnetic memory device may include a magnetic tunnel junction (MTJ). A magnetic tunnel junction may include two magnetic layers and a tunnel barrier layer interposed therebetween. Resistance of the magnetic tunnel junction may change according to the magnetization orientations of the magnetic layers. For example, the resistance of the magnetic tunnel junction may be higher when the magnetic layers have anti-parallel magnetization orientations than when they have parallel magnetization orientations. Such a difference in resistance can be used for data storing operations of a magnetic memory device. However, more research is still needed to mass-produce magnetic memory devices.

SUMMARY

Example embodiments of the inventive concept provide a highly-reliable magnetic memory device.

Other example embodiments of the inventive concept provide a magnetic memory device that can be readily fabricated.

In exemplary embodiments in accordance with principles of inventive concepts, a magnetic memory device may include a lower electrode on a substrate, a memory element on the lower electrode, an upper electrode on the memory element, and a protection spacer enclosing a portion of a side surface of the lower electrode and protruding laterally from the side surface of the lower electrode. The protection spacer may have a bottom surface that is positioned at a level higher than that of a bottom surface of the lower electrode.

In example embodiments, the magnetic memory device may further include an insulating spacer enclosing at least a portion of the side surface of the lower electrode. The insulating spacer may be located between the lower electrode and the protection spacer, and the protection spacer may enclose a portion of a side surface of the insulating spacer and may protrude laterally from the side surface of the insulating spacer.

In example embodiments, the bottom surface of the protection spacer may be positioned at a level higher than that of a bottom surface of the insulating spacer.

In example embodiments, the protection spacer may have a top surface positioned at substantially the same level as that of a top surface of the lower electrode.

In example embodiments, the protection spacer may have a top surface positioned at a level lower than that of a top surface of the lower electrode.

In exemplary embodiments in accordance with principles of inventive concepts, a magnetic memory device may include a lower electrode on a substrate, a memory element on the lower electrode, an upper electrode on the memory element, and a protection spacer enclosing a portion of a side surface of the lower electrode and protruding laterally from the side surface of the lower electrode. The memory element may include a first magnetic pattern, a tunnel barrier pattern, and a second magnetic pattern sequentially stacked on the lower electrode, and the first magnetic pattern and the tunnel barrier pattern may be provided to cover not only a top surface of the lower electrode but also a portion of the side surface of the lower electrode. The protection spacer may have a bottom surface that is positioned at a level higher than that of a bottom surface of the lower electrode.

In example embodiments, the second magnetic pattern may be locally located on the top surface of the tunnel barrier pattern, and an area of a bottom surface of the second magnetic pattern may be smaller than that of a top surface of the tunnel barrier pattern.

In example embodiments, the magnetic memory device may further include an insulating layer covering the lower electrode, the memory element, and protection layer. The protection spacer may be located between the side surface of the lower electrode and the first magnetic pattern, and the bottom surface of the protection spacer may be in contact with then insulating layer.

In example embodiments, the first magnetic pattern and the tunnel barrier pattern may be provided to cover at least a portion of a top surface of the protection spacer and at least a portion of a side surface of the protection spacer.

In example embodiments, the magnetic memory device may further include an insulating spacer enclosing the side surface of the lower electrode. The insulating spacer may be located between the protection spacer and the lower electrode, and the lower electrode, the insulating spacer, and the protection spacer may have top surfaces coplanar with each other.

In example embodiments, the magnetic memory device may further include an insulating spacer enclosing the side surface of the lower electrode. The insulating spacer may be located between the protection spacer and the lower electrode, the insulating spacer may have a top surface coplanar with the top surface of the lower electrode, and the protection spacer may have a top surface positioned at a level lower than that of the top surface of the lower electrode.

In example embodiments, the magnetic memory device may further include an insulating spacer enclosing the side surface of the lower electrode. The insulating spacer may be located between the protection spacer and the lower electrode, the insulating spacer may have a top surface coplanar with a top surface of the protection spacer, and the top surface of the protection spacer may be positioned at a level lower than that of the top surface of the lower electrode.

In example embodiments, one of the first and second magnetic patterns may have a magnetization direction fixed to a specific direction, and the other may have a magnetization direction that can be changed to be parallel or antiparallel to the specific direction.

In example embodiments, the first magnetic pattern may be in direct contact with the side surface of the lower electrode. In example embodiments, the protection spacer may include a slanted outer side surface.

In exemplary embodiments in accordance with principles of inventive concepts, a magnetic memory device may include a first insulating layer on a substrate, lower electrodes spaced apart from each other on the first insulating layer, memory elements disposed on the lower electrodes, respectively, upper electrodes disposed on the memory elements, respectively, protection spacers enclosing side surfaces of the lower electrodes, respectively, and a residue layer disposed on the first insulating layer and between the lower electrodes. The residue layer may include a magnetic material. Each of the protection spacers may have a bottom surface that is positioned at a level higher than that of a bottom surface of each of the lower electrodes.

In example embodiments, the magnetic memory device may further include a second insulating layer disposed between the lower electrodes to cover the residue layer. The bottom surface of each of the protection spacers may be in contact with the second insulating layer.

In example embodiments, each of the memory elements may include a first magnetic pattern, a tunnel barrier pattern, and a second magnetic pattern sequentially stacked on each of the lower electrodes. The residue layer may include at least the same magnetic material as the first magnetic pattern.

In example embodiments, the magnetic memory device may further include insulating spacers enclosing the side surfaces of the lower electrodes, respectively. Each of the insulating spacers may be located between each of the lower electrodes and each of the protection spacers. Each of the protection spacers may enclose a portion of a side surface of each of the insulating spacers.

In example embodiments, the bottom surface of each of the protection spacers may be positioned at a level higher than that of a bottom surface of each of the insulating spacers.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
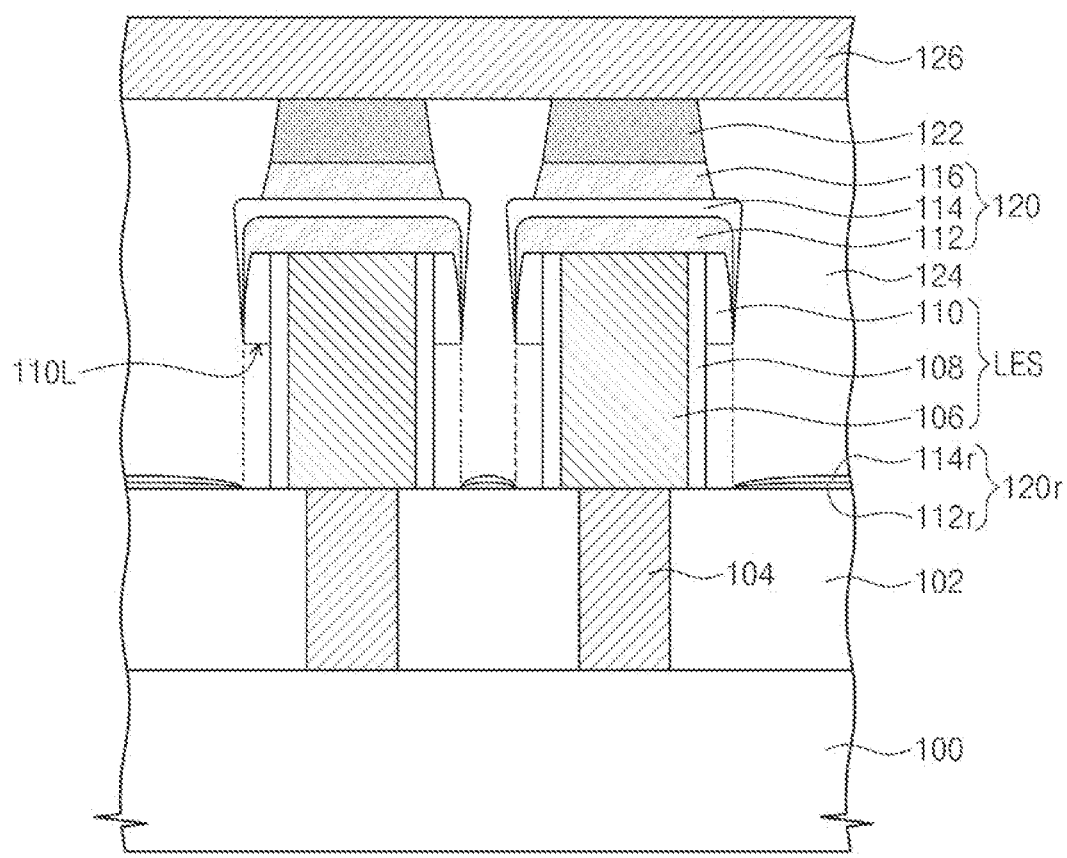
FIG. 1 is a sectional view illustrating a magnetic memory device according to a first exemplary embodiment in accordance with principles of inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
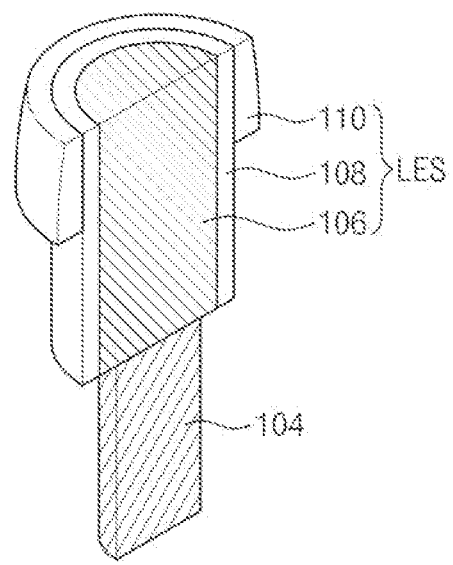
FIG. 2 is a perspective view illustrating a lower electrode structure according to the first exemplary embodiment in accordance with principles of inventive concepts.
Figure 3:
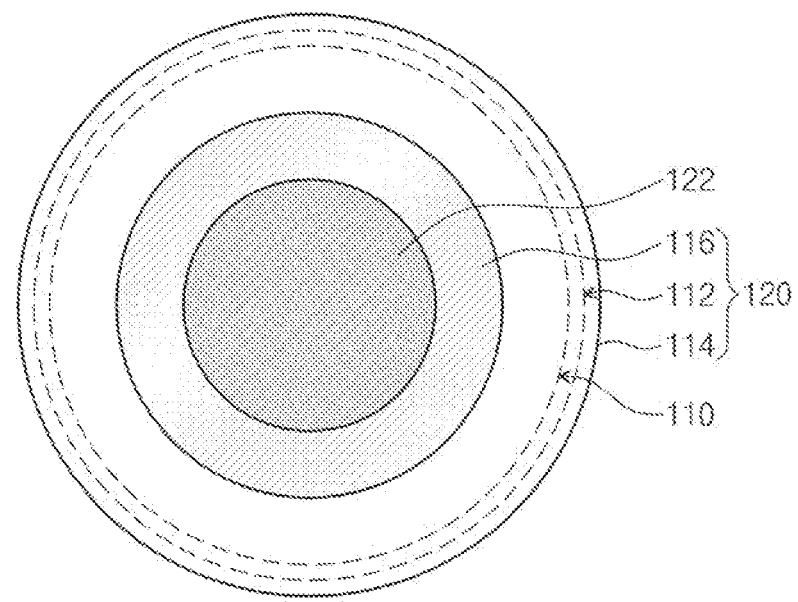
FIG. 3 is a plan view illustrating a memory element in exemplary embodiments in accordance with principles of inventive concepts.
Figure 4A:
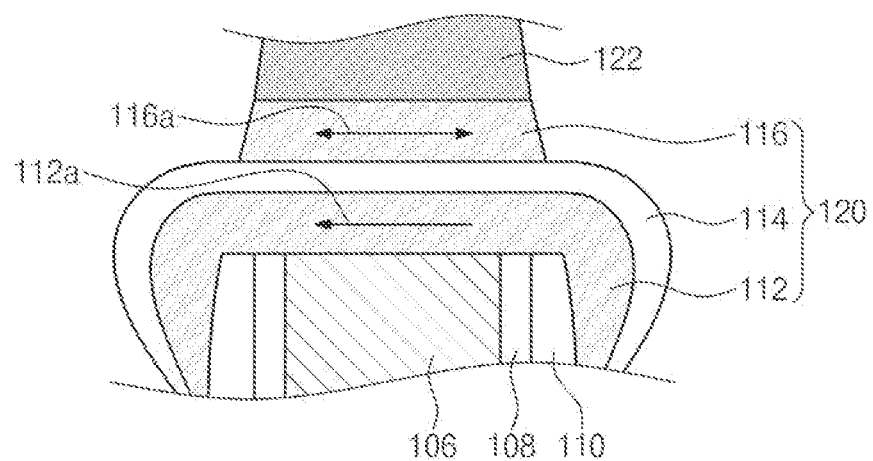
FIG. 4A is a sectional view illustrating an example of the memory element in exemplary embodiments in accordance with principles of inventive concepts.
Figure 4B:
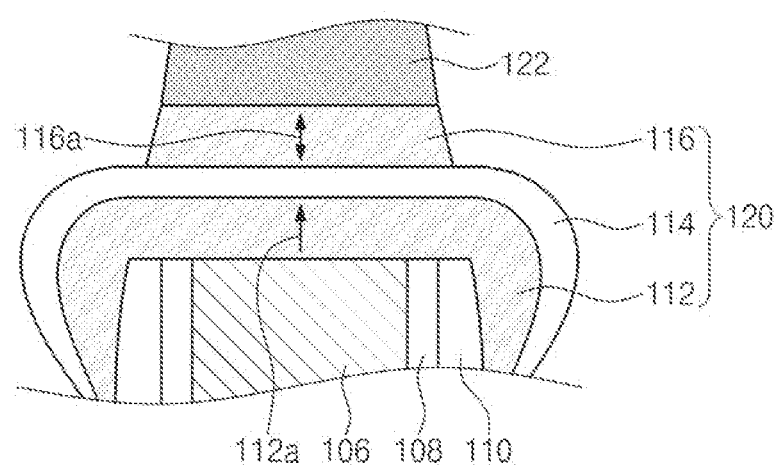
FIG. 4B is a sectional view illustrating another example of the memory element in exemplary embodiments in accordance with principles of inventive concepts.

FIG. 1 is a sectional view illustrating a magnetic memory device according to a first exemplary embodiment in accordance with principles of inventive concepts. FIG. 2 is a perspective view illustrating a lower electrode structure according to the first exemplary embodiment in accordance with principles of inventive concepts. FIG. 3 is a plan view illustrating a memory element in exemplary embodiments in accordance with principles of inventive concepts. FIG. 4A is a sectional view illustrating an example of the memory element in exemplary embodiments in accordance with principles of inventive concepts, and FIG. 4B is a sectional view illustrating another example of the memory element in exemplary embodiments in accordance with principles of inventive concepts.

Referring to FIGS. 1 and 2, a lower interlayer insulating layer 102 may be provided on a substrate 100. The lower interlayer insulating layer 102 may cover switching devices (not shown) formed on the substrate 100. A lower contact plug 104 may be provided in the lower interlayer insulating layer 102 to penetrate the lower interlayer insulating layer 102. The lower contact plug 104 may be electrically connected to one of the terminals or electrodes of the switching devices. The lower interlayer insulating layer 102 may include at least one of an oxide layer, a nitride layer, and/or an oxynitride layer, and the lower contact plug 104 may include a conductive material.

A lower electrode 106 may be provided on the lower interlayer insulating layer 102. A bottom surface of the lower electrode 106 may contact a top surface of the lower contact plug 104. In example embodiments, as shown in FIG. 2, the lower electrode 106 may be shaped like a pillar. An insulating spacer 108 may be provided to enclose a side surface of the lower electrode 106. In example embodiments, the insulating spacer 108 may cover the whole side surface of the lower electrode 106. The lower electrode 106, alone or along with the insulating spacer 108, may be provided to cover the whole top surface of the lower contact plug 104. The top surface of the insulating spacer 108 may be substantially coplanar with that of the lower electrode 106. A bottom surface of the insulating spacer 108 may be substantially coplanar with that of the lower electrode 106.

A protection spacer 110 may be provided to partially enclose a side surface of the insulating spacer 108. The protection spacer 110 may protrude laterally from the side surface of the insulating spacer 108. In example embodiments, a bottom surface 110L of the protection spacer 110 may be positioned at a level higher than the bottom surface of the lower electrode 106. A top surface of the protection spacer 110 opposite the bottom surface 110L of the protection spacer 110 may be positioned at the same level as the top surface of the lower electrode 106.

In example embodiments, the lower electrode 106, the insulating spacer 108, and the protection spacer 110 may constitute a lower electrode structure LES. The lower electrode 106 may include a conductive material. For example, the lower electrode 106 may include a conductive metal nitride (e.g., titanium nitride and/or tantalum nitride). The insulating spacer 108 may include a nitride (e.g., silicon nitride) and/or an oxynitride (e.g., siliconoxynitride). The protection spacer 110 may include a nitride (e.g., silicon nitride).

Referring to FIGS. 1 and 3, a memory element 120 may be provided on the lower electrode 106. In example embodiments, the memory element 120 may be a magnetic tunnel junction pattern. For example, the memory element 120 may include a first magnetic pattern 112, a tunnel barrier pattern 114, and a second magnetic pattern 116 sequentially stacked on the lower electrode 106. One of the first and second magnetic patterns 112 and 116 may be configured to have a fixed magnetization direction, thereby serving as a reference pattern, whereas the other may be configured to have a switchable magnetization direction (e.g., parallel or antiparallel to the magnetization direction of the reference pattern), thereby serving as a free pattern.

The first magnetic pattern 112 may cover not only the top surface of the lower electrode 106 but also a portion of the side surface of the lower electrode 106. For example, the first magnetic pattern 112 may cover the top surfaces of the lower electrode 106, the insulating spacer 108, and the protection spacer 110. In addition, the first magnetic pattern 112 may include a vertical portion extending along and partially enclosing the side surface of the lower electrode 106. For example, upper portions of the insulating and protection spacers 108 and 110 may be interposed between the vertical portion of the first magnetic pattern 112 and the side surface of the lower electrode 106.

The tunnel barrier pattern 114 may be provided on the top surface of the first magnetic pattern 112. The tunnel barrier pattern 114 may cover the top surface of the first magnetic pattern 112 and include a vertical portion extending along and enclosing the side surface of the first magnetic pattern 112. For example, the tunnel barrier pattern 114 may include a horizontal portion provided on the top surfaces of the first magnetic pattern 112 and a vertical portion extending along the vertical portion of the first magnetic pattern 112. For example, the tunnel barrier pattern 114 may cover the top surfaces of the lower electrode 106 and a portion of the side surface of the lower electrode 106. In exemplary embodiments, the vertical portion of the tunnel barrier pattern 114 may be provided to enclose at least a portion of the side surface of the protection spacer 110.

The second magnetic pattern 116 may be locally provided on a portion of the top surface of the tunnel barrier pattern 114. For example, the second magnetic pattern 116 may have a bottom surface the area of which is smaller than that of the top surface of the tunnel barrier pattern 114. In exemplary embodiments, the whole bottom surface of the second magnetic pattern 116 may be overlapped with a central region of the top surface of the tunnel barrier pattern 114.

An upper electrode 122 may be provided on the memory element 120. In other words, the memory element 120 may be disposed between the lower electrode 106 and the upper electrode 122. In example embodiments, the upper electrode 122 may be locally provided on the top surface of the second magnetic pattern 116.

In example embodiments, when viewed in a plan view, the top surface of the lower electrode 106 may be shaped like a circle. Accordingly, the protection spacer 110 may be shaped like a circular ring, as shown in FIG. 2 and FIG. 3. Further, each of the top surfaces of the first magnetic pattern 112, the tunnel barrier pattern 114, the second magnetic pattern 116, and the upper electrode 122 may also be shaped like a circle, when viewed in a plan view, as shown in FIG. 3.

The upper electrode 122 may include a conductive material. For example, the upper electrode 122 may include tungsten, titanium, tantalum, aluminum, and/or metal nitride (e.g., titanium nitride and/or tantalum nitride).

The memory element 120 may be configured to store logic data. In exemplary embodiments in accordance with principles of inventive concepts, various data-writing mechanisms may be used to change the logic data stored in the memory element 120. Hereinafter, the memory element 120 will be described in more detail with reference to FIGS. 4A and 4B.

As shown in FIG. 4A, the first and second magnetic patterns 112 and 116 may have magnetization directions 112a and 116a that are substantially parallel to an interface between the tunnel barrier pattern 114 and the second magnetic pattern 116 or the top surface of the lower electrode 106. In other words, the first and second magnetic patterns 112 and 116 may be configured to have an in-plane magnetization property. As shown in FIG. 4A, the first magnetic pattern 112 may be used as the reference pattern, and the second magnetic pattern 116 may be used as the free pattern, but example embodiments of the inventive concept are not be limited thereto. For example, unlike the structure of FIG. 4A, the first magnetic pattern 112 may be used as the free pattern, and the second magnetic pattern 116 may be used as the reference pattern. In exemplary embodiments, the reference pattern may be thicker than the free pattern, and the reference pattern may have a coercive force that is stronger than that of the free pattern.

The first and second magnetic patterns 112 and 116 with the in-plane magnetization property may include a ferromagnetic material. The first magnetic pattern 112 may further include an anti-ferromagnetic material allowing for the ferromagnetic material of the first magnetic pattern 112 to have a fixed magnetization direction.

In other example embodiments, as shown in FIG. 4B, the first and second magnetic patterns 112 and 116 may have magnetization directions 112a and 116a that are substantially perpendicular to the interface between the tunnel barrier pattern 114 and the second magnetic pattern 116 or the top surface of the lower electrode 106. In other words, the first and second magnetic patterns 112 and 116 may be configured to have a perpendicular magnetization property. As shown in FIG. 4B, the first and second magnetic patterns 112 and 116 may be used as the reference and free patterns, respectively, but unlike the structure of FIG. 4B, the first and second magnetic patterns 112 and 116 may be used as the free and reference patterns, respectively.

The first and second magnetic patterns 112 and 116 having the perpendicular magnetization directions 112a and 116a may include at least one of perpendicular magnetic materials (e.g., CoFeTb, CoFeGd, and/or CoFeDy), perpendicular magnetic materials with $L1_0$ structure, CoPt-based materials with hexagonal-close-packed structure, and/or perpendicular magnetic structures. Here, the perpendicular magnetic materials with $L1_0$ structure may include at least one of $L1_0$ FePt, $L1_J$ FePd, $L1_O$ CoPd, and/or $L1_O$ CoPt. The perpendicular magnetic structures may include magnetic layers and nonmagnetic layers that are alternatingly and repeatedly stacked. For example, the perpendicular magnetic structures may include at least one of (Co/Pt)n, (CoFe/Pt)n, (CoFe/Pd)n, (Co/Pd)n, (Co/Ni)n, (CoNi/Pt)n, (CoCr/Pt)n and/or (CoCr/Pd)n, where n is the number of stacked pairs of the layers.

The tunnel barrier pattern 114 may include at least one of magnesium oxide, titanium oxide, aluminum oxide, magnesium-zinc oxide, and/ or magnesium-boron oxide.

Referring back to FIG. 1, a residue layer 120r may remain on the lower interlayer insulating layer 102 and between a plurality of the lower electrodes 106. In example embodiments, the residue layer 120r may include at least a magnetic material. For example, the residue layer 120r may include a first layer 112r containing the same material as the first magnetic pattern 112 and a second layer 114r containing the same material as the tunnel barrier pattern 114.

An upper interlayer insulating layer 124 may be provided on the lower interlayer insulating layer 102 to cover the lower electrode structure LES, the memory element 120, and the upper electrode 122. Since the protection spacer 110 protrudes laterally from the side surface of the insulating spacer 108, the bottom surface 110L of the protection spacer 110 may be in contact with the upper interlayer insulating layer 124. In other words, the first magnetic pattern 112 and/or the tunnel barrier pattern 114 may not be interposed between the bottom surface 110L of the protection spacer 110 and the upper interlayer insulating layer 124. The upper interlayer insulating layer 124 may include at least one of an oxide layer, a nitride layer, and/or an oxynitride layer.

An interconnection line 126 may be provided on the upper interlayer insulating layer 124. The interconnection line 126 may extend along a specific direction. The interconnection line 126 may be connected to a plurality of the upper electrodes 122 arranged along the specific direction. The interconnection line 126 may be electrically connected to the memory element 120 via the upper electrode 122. The interconnection line 126 may serve as a bit line.

FIGS. 5 through 11 are sectional views illustrating a method of fabricating a magnetic memory device according to a first exemplary embodiment in accordance with principles of inventive concepts.

Figure 5:
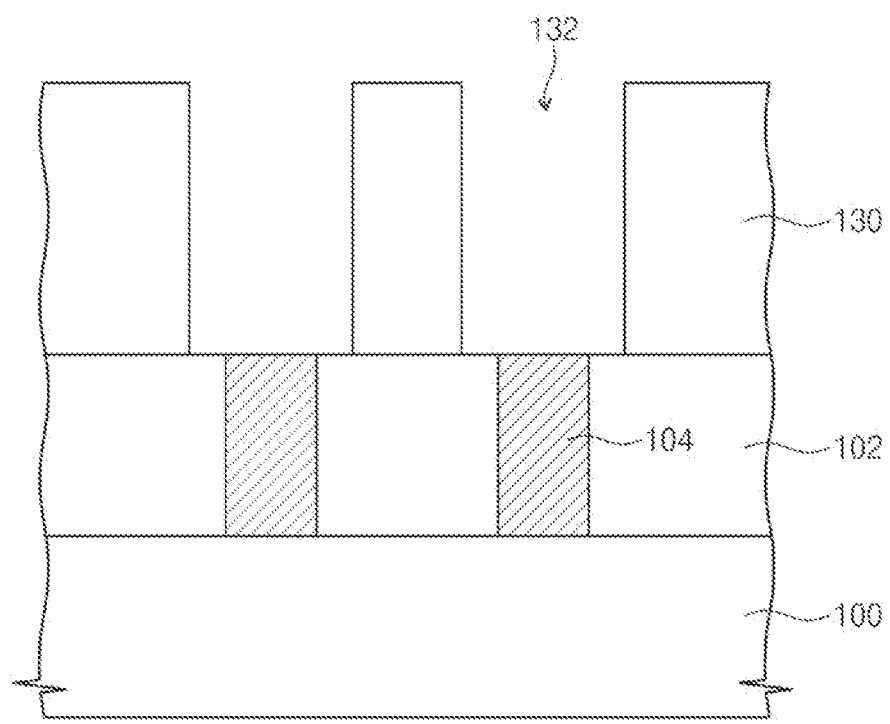
FIGS. 5 through 11 are sectional views illustrating a method of fabricating a magnetic memory device according to a first exemplary embodiment in accordance with principles of inventive concepts.

Referring to FIG. 5, the lower interlayer insulating layer 102 may be formed on the substrate 100. The substrate 100 may include a semiconductor wafer. For example, the substrate 100 may include a silicon wafer, a germanium wafer, or a silicon-germanium wafer. In example embodiments, switching devices (not shown) may be formed on the substrate 100, and the lower interlayer insulating layer 102 may be formed to cover the switching devices. The switching device may be a field effect transistor. Alternatively, the switching device may be a diode. The lower interlayer insulating layer 102 may be formed to have a single- or multi-layered structure including an oxide layer, a nitride layer, and/or an oxynitride layer.

The lower contact plug 104 may be formed to penetrate the lower interlayer insulating layer 102. The lower contact plug 104 may be electrically connected to one of terminals of the switching devices. The lower contact plug 104 may include a doped semiconductor material (e.g., doped silicon), a metal (e.g., tungsten, titanium, and/or tantalum), a conductive metal nitride (e.g., titanium nitride, tantalum nitride, and/or tungsten nitride), and/or a metal-semiconductor compound (e.g., metal silicide).

A first mold layer 130 may be formed on the lower interlayer insulating layer 102. The lower interlayer insulating layer 102 may be formed in such a way that its upper portion has an etch selectivity with respect to the first mold layer 130. For example, the lower interlayer insulating layer 102 may be formed of a silicon oxide layer and a silicon nitride layer that are sequentially stacked on the substrate 100, and the first mold layer 130 may be formed of the silicon oxide layer.

The first mold layer 130 may be patterned to form an opening 132 exposing the lower contact plug 104. In example embodiments, the opening 132 may be formed to have a hole-shaped structure.

Figure 6:
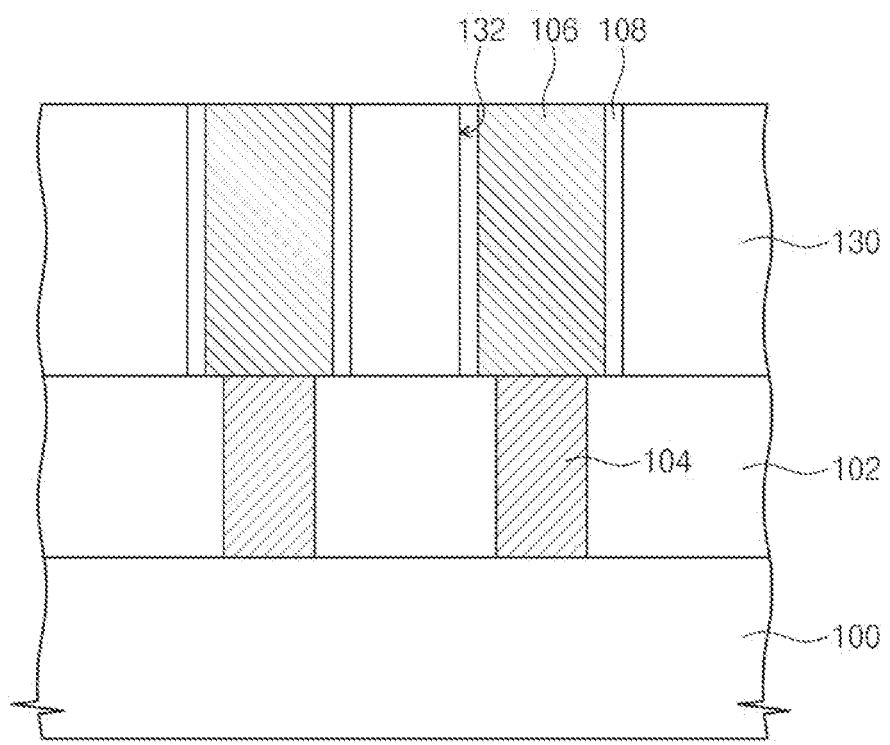

Referring to FIG. 6, the insulating spacer 108 may be formed on an inner side surface of the opening 132. In exemplary embodiments, the insulating spacer 108 may be formed to expose the lower contact plug 104. For example, the formation of the insulating spacer 108 may include conformally forming an insulating layer on the substrate 100 with the opening 132. In other words, the insulating layer may be formed to incompletely fill the opening 132. Thereafter, the insulating layer may be etched to expose the top surfaces of the first mold layer 130 and the lower contact plug 104. The etching of the insulating layer may be performed using, for example, an etch-back process. Accordingly, the insulating spacer 108 may be locally formed on the inner side surface of the opening 132. The insulating spacer 108 may be formed of a material having an etch selectivity with respect to the first mold layer 130. For example, the insulating spacer 108 may be formed of silicon nitride, and the first mold layer 130 may be formed of silicon oxide.

Next, a conductive layer may be formed to fill the opening 132. The conductive layer may be planarized to expose the first mold layer 130, and as a result, the lower electrode 106 may be locally formed in the opening 132.

Figure 7:
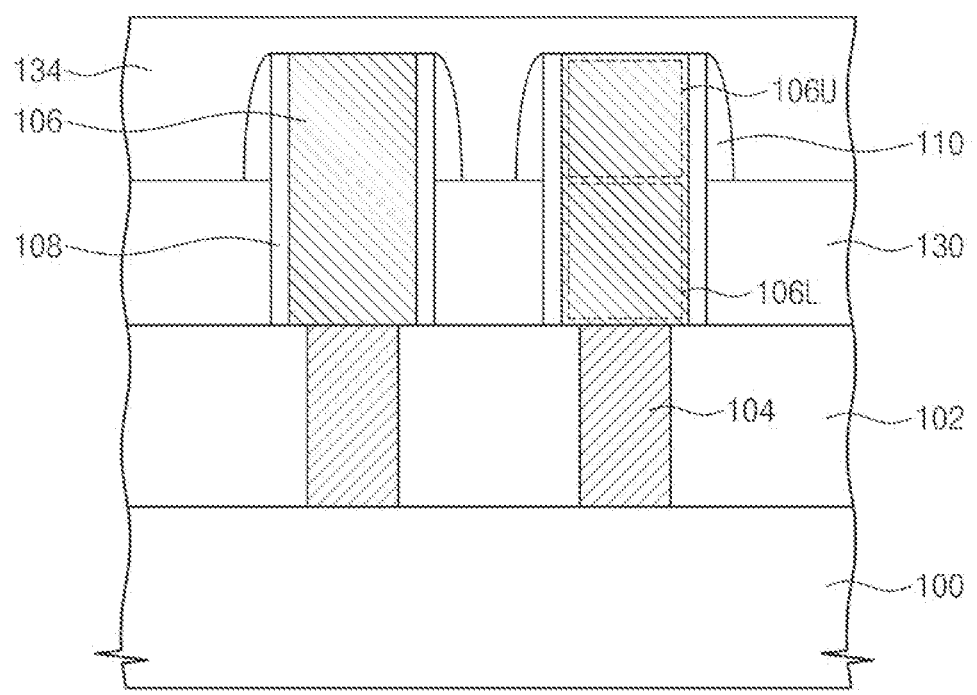

Referring to FIG. 7, an upper portion of the first mold layer 130 may be removed. The partial removal of the first mold layer 130 may be performed using an etching process having a etch selectivity with respect to the insulating spacer 108 and the lower electrode 106. In exemplary embodiments, the partial removal of the first mold layer 130 may be performed using a wet etching process. As a result of the partial removal of the first mold layer 130, an outer side surface of the insulating spacer 108 may be partially exposed.

Further, as a result of the partial removal of the first mold layer 130, the lower electrode 106 may have a lower portion 106L, which is enclosed by the first mold layer 130, and an upper portion 106U, which is not enclosed by the first mold layer 130. The insulating spacer 108 may include a lower portion interposed between the lower portion 106L of the lower electrode 106 and the first mold layer 130. By contrast, an upper portion of the insulating spacer 108 may not be enclosed by the first mold layer 130 and may be exposed.

The protection spacer 110 may be formed on an outer side surface of the upper portion of the insulating spacer 108. For example, the formation of the protection spacer 110 may include conformally forming a protection layer on the substrate 100 and then etching the protection layer to expose top surfaces of the first mold layer 130 and the lower electrode 106. The etching of the protection layer may be performed using, for example, an etch-back process. Accordingly, the protection spacer 110 may be locally formed on the outer side surface of the upper portion of the insulating spacer 108. In other words, the protection spacer 110 may be formed to enclose the upper portion 106U of the lower electrode 106, and the insulating spacer 108 may be interposed between the upper portion 106U of the lower electrode 106 and the protection spacer 110.

The protection spacer 110 may be formed of a material having a etch selectivity with respect to the first mold layer 130. For example, the protection spacer 110 may be formed of silicon nitride, and the first mold layer 130 may be formed of silicon oxide. Thereafter, a second mold layer 134 may be formed on the first mold layer 130 to cover the protection spacer 110 and the lower electrode 106. The second mold layer 134 may be formed of, for example, silicon oxide.

Figure 8:
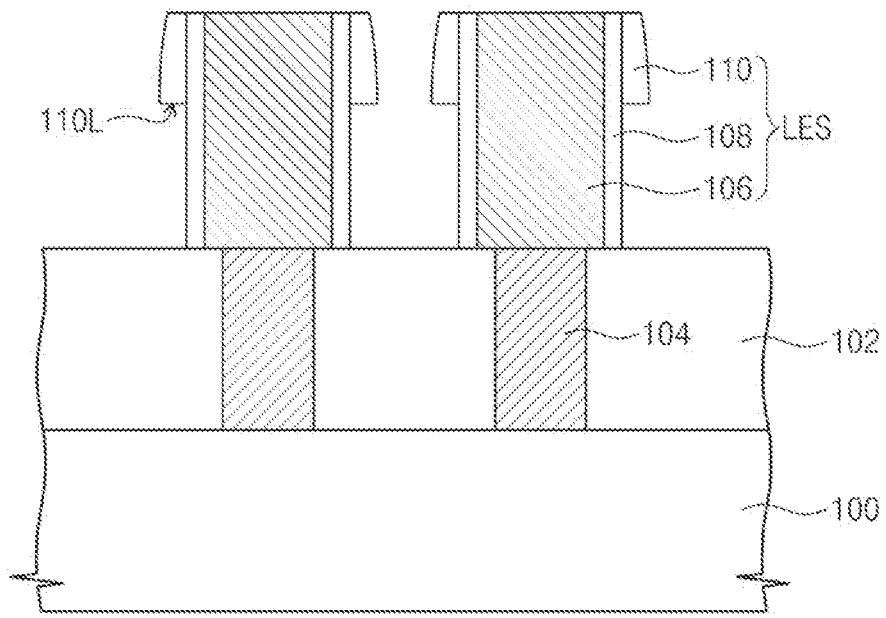

Referring to FIG. 8, the second mold layer 134 may be planarized to expose the top surface of the lower electrode 106. In exemplary embodiments, the lower electrode 106, the insulating spacer 108, and the protection spacer 110 may also be planarized, during the planarization process. For example, the lower electrode 106, the insulating spacer 108, and the protection spacer 110 may be formed to have top surfaces that are substantially coplanar with each other.

Thereafter, the first and second mold layers 130 and 134 may be removed. The removal of the first and second mold layers 130 and 134 may be performed using an etching process having an etch selectivity with respect to the lower electrode 106, the insulating spacer 108, and the protection spacer 110. Further, the first and second mold layers 130 and 134 may be removed by, for example, a wet etching process. In exemplary embodiments, although not shown, after the etching process, a portion of the first mold layer 130 may remain on the lower interlayer insulating layer 102. However, in other example embodiments, the etching process may be performed to completely remove the first and second mold layers 130 and 134. In such embodiments, the etching process may be performed using an etch recipe having an etch selectivity with respect to an upper portion of the lower interlayer insulating layer 102.

As a result of the removal of the first and second mold layers 130 and 134, the lower electrode structure LES may be exposed. The lower electrode structure LES may include the lower electrode 106, the insulating spacer 108, and the protection spacer 110. The protection spacer 110 may have a shape protruding laterally from the outer side surface of the insulating spacer 108 toward a direction perpendicular to the outer side surface of the insulating spacer 108, or a direction parallel to the top surface of the substrate 100. The bottom surface 110L of the protection spacer 110 may be positioned at a level higher than that of the bottom surface of the lower electrode 106.

Figure 9:
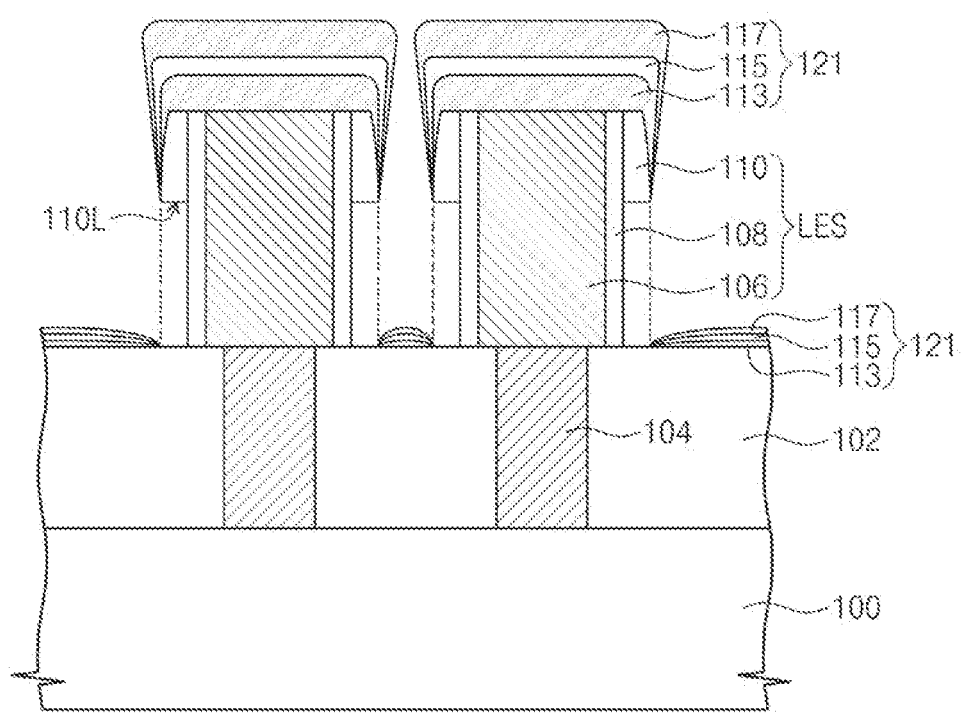

Referring to FIG. 9, a memory layer 121 may be formed on the substrate 100 provided with the lower electrode structure LES. The memory layer 121 may be fowled to cover the top surface and a portion of the side surface of the lower electrode 106. The memory layer 121 may be thicker on the top surface of the lower electrode 106 than on the side surface of the lower electrode 106. The memory layer 121 may be formed using a physical vapor deposition (PVD) method or a chemical vapor deposition (CVD) method having a poor step coverage property.

The memory layer 121 may be in contact with the top surface of the lower electrode 106. By contrast, the insulating spacer 108 and the protection spacer 110 may be interposed between the memory layer 121 and the side surface of the lower electrode 106, and thus, the memory layer 121 may not be in contact with the side surface of the lower electrode 106.

Since the protection spacer 110 has a shape protruding laterally from the outer side surface of the insulating spacer 108, the memory layer 121 may not be continuously deposited along the side surface of the lower electrode 106. For example, the memory layer 121 may not be formed on at least the bottom surface 110L of the protection spacer 110. In addition, as shown in FIG. 9, the memory layer 121 may be formed on the lower interlayer insulating layer 102 between the lower electrodes 106. In example embodiments, the memory layer 121 may not be formed on a portion of the lower interlayer insulating layer 102, which is overlapped with at least the protection spacer 110 in a plan view. In other words, portions of the memory layer 121, which are formed on the lower electrodes 106, respectively, may be electrically separated from each other.

In exemplary embodiments in which the memory layer 121 is continuously deposited on the side surface of the lower electrode 106 and the top surface of the lower interlayer insulating layer, the portions of the memory layer 121 on the lower electrodes 106 may be electrically connected to each other. To prevent such a problem of short circuit, the portions of the memory layer 121 on the lower electrodes 106 should be electrically separated from each other in a subsequent process.

In exemplary embodiments in accordance with principles of inventive concepts, the memory layer 121 may be formed in such a way that the portions of the memory layer 121 on the lower electrodes 106 can be electrically separated from each other during its deposition step. Accordingly, it is unnecessary to perform a subsequent process for electrically separating the portions of the memory layer 121 on the lower electrodes 106.

The lower electrode 106 and the insulating spacer 108 may cover the whole top surface of the lower contact plug 104. Accordingly, between the lower electrodes 106, the memory layer 121 on the lower interlayer insulating layer 102 may be separated from the lower contact plug 104.

In example embodiments, the memory layer 121 may be a magnetic tunnel junction layer, which may include a first magnetic layer 113, a tunnel barrier layer 115, and a second magnetic layer 117 that are sequentially stacked on the substrate 100. One of the first and second magnetic layers 113 and 117 may serve as a reference layer with a fixed magnetization direction, and the other may serve as a free layer, whose magnetization direction can be switched to be parallel or anti-parallel to that of the reference layer.

In exemplary embodiments, the magnetization directions of the reference and free layers may be substantially perpendicular to the top surface of the lower electrode 106. For example, the reference and free layers may include at least one of perpendicular magnetic materials (e.g., CoFeTb, CoFeGd, and/or CoFeDy), perpendicular magnetic materials with $L1_0$ structure, CoPt-based materials with hexagonal-close-packed structure, and/or perpendicular magnetic structures. Here, the perpendicular magnetic materials with $L1_0$ structure may include at least one of $L1_0$ FePt, $L1_0$ FePd, $L1_0$ CoPd, and/or $L1_0$ CoPt. The perpendicular magnetic structures may include magnetic layers and non-magnetic layers that are alternatingly and repeatedly stacked. For example, the perpendicular magnetic structures may include at least one of (Co/Pt)n, (CoFe/Pt)n, (CoFe/Pd)n, (Co/Pd)n, (Co/Ni)n, (CoNi/Pt)n, (CoCr/Pt)n and/or (CoCr/Pd)n, where n is the number of stacked pairs of the layers. Here, the reference layer may be thicker than the free layer, and the reference layer may have a coercive force that is stronger than that of the free layer.

In other example embodiments, the magnetization directions of the reference and free layers may be substantially parallel to the top surface of the lower electrode 106. For example, each of the reference and free layers may include a ferromagnetic material. The reference layer may further include an anti-ferromagnetic material to fix the magnetization direction of the ferromagnetic material.

The tunnel barrier layer 115 may include at least one of magnesium oxide, titanium oxide, aluminum oxide, magnesium-zinc oxide, and/or magnesium-boron oxide.

Each of the first magnetic layer 113, the tunnel barrier layer 115, and the second magnetic layer 117 may be formed using a physical vapor deposition (PVD) method or a chemical vapor deposition (CVD) method having a poor step coverage property. Accordingly, each of the layers 113, 115, and 117 may be thicker on the top surface of the lower electrode 106 than on the side surface of the lower electrode 106.

Figure 10:
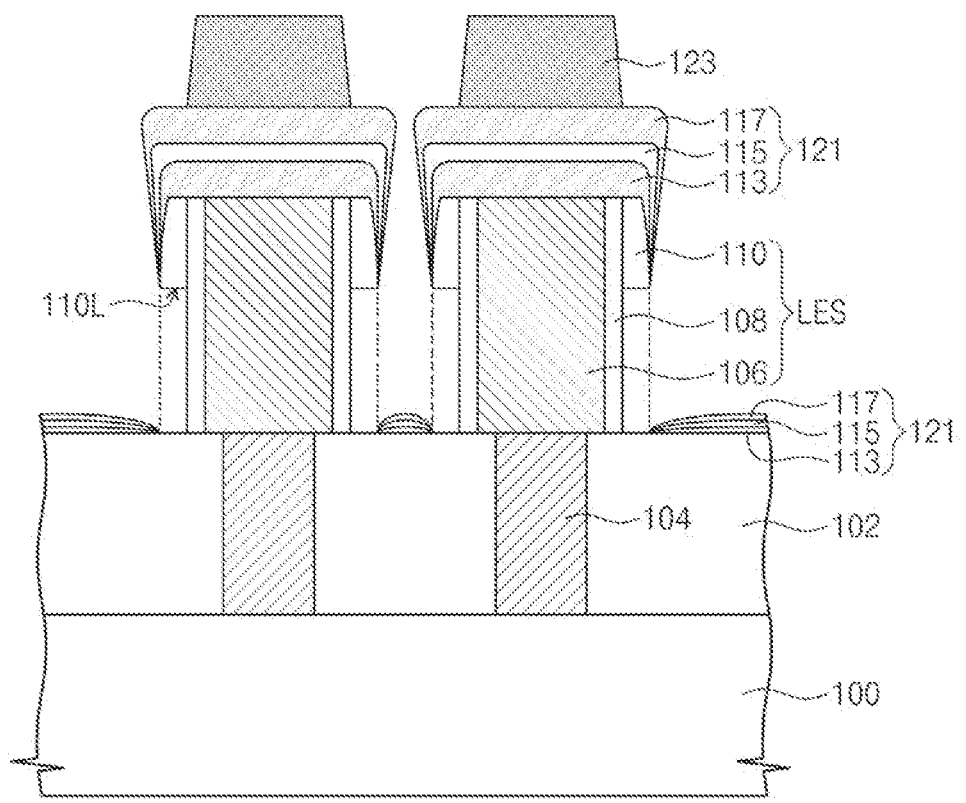

Referring to FIG. 10, a conductive pattern 123 may be formed on the substrate 100 provided with the memory layer 121. The formation of the conductive pattern 123 may include forming a conductive layer on the substrate 100 provided with the memory layer 121 and patterning the conductive layer. The conductive layer may be formed using a physical vapor deposition (PVD) method or a chemical vapor deposition (CVD) method having a poor step coverage property. The conductive layer may include at least one of tungsten, titanium, tantalum, aluminum, and/or metal nitride (e.g., titanium nitride and/or tantalum nitride). The patterning of the conductive layer may include forming a mask pattern on the conductive layer to define the conductive pattern 123 and etching the conductive layer using the mask pattern as an etch mask. The etching of the conductive layer may be performed using an etch recipe having an etch selectivity with respect to the second magnetic layer 117, the insulating spacer 108, the protection spacer 110, and the lower interlayer insulating layer 102. The etching process may be, for example, a dry or wet etching process. After the etching process, the mask pattern may be removed.

The conductive pattern 123 may be formed on the memory layer 121 provided on the lower electrode 106. In other words, the conductive pattern 123 may be formed to be overlapped with at least a portion of the top surface of the lower electrode 106. Accordingly, the conductive pattern 123 may be formed to expose a portion of the memory layer 121 provided on the side surface of the lower electrode 106.

Figure 11:
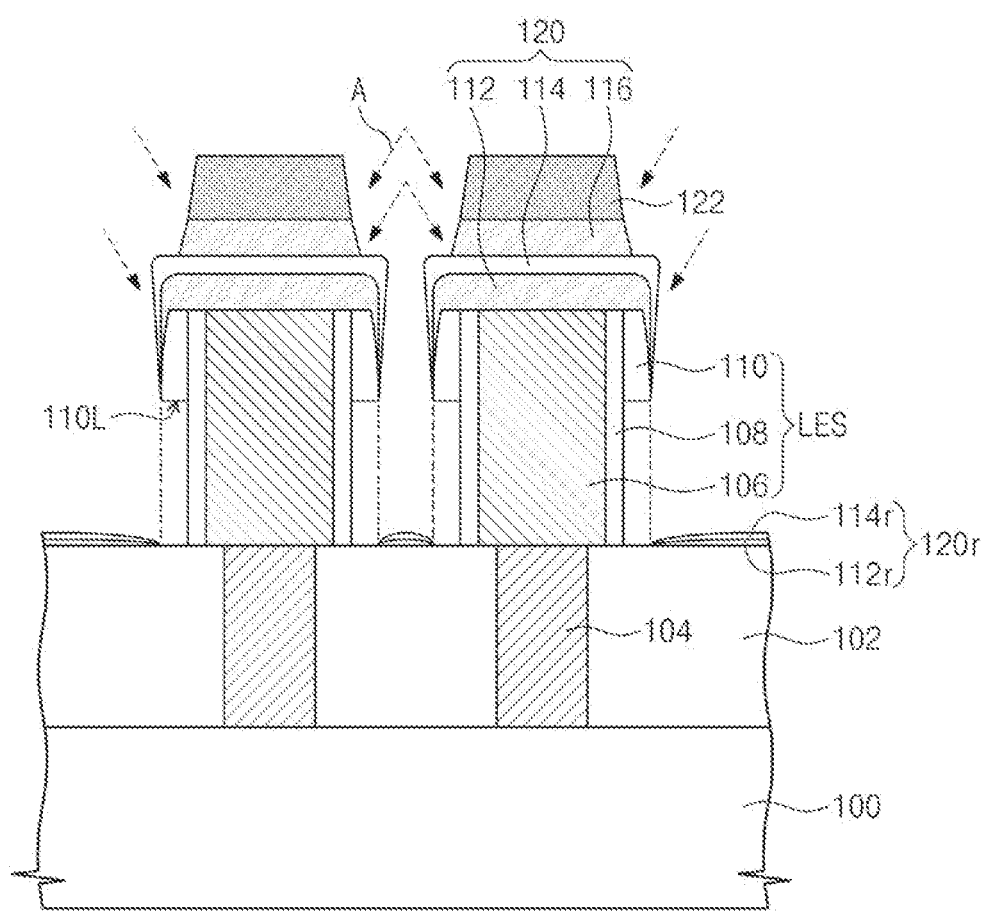

Referring to FIG. 11, the exposed portion of the memory layer 121 may be etched to form the memory element 120.

For example, the exposed portion of the memory layer 121 may be etched by a tilted anisotropic etching process, which is performed to have an etching direction A at an angle to the top surface of the substrate 100. The tilted anisotropic etching process may be performed using an ion beam etching technology. As a result of the anisotropic etching process, the second magnetic layer 117 may be removed from the side surface of the lower electrode 106 to expose a portion of the tunnel barrier layer 115 provided on the side surface of the lower electrode 106. Accordingly, the first and second magnetic layers 113 and 117 can be electrically separated from each other.

In exemplary embodiments in which the memory layer 121 is continuously deposited on the side surface of the lower electrode 106 and the top surface of the lower interlayer insulating layer 102, the portions of the memory layer 121 on the lower electrodes 106 may be electrically connected to each other. To prevent such an unintentional electric connection, the portions of the memory layer 121 on the lower electrodes 106 should be electrically separated from each other during the anisotropic etching process. In other words, the anisotropic etching process may be performed to etch not only the second magnetic layer 117 but also the tunnel barrier layer 115 and the first magnetic layer 113.

In exemplary embodiments in accordance with principles of inventive concepts, the memory layer 121 may be formed in such a way that the portions of the memory layer 121 on the lower electrodes 106 can be electrically separated from each other during its deposition step. For example, the anisotropic etching process may be performed to etch the second magnetic layer 117 and electrically separate the first and second magnetic layers 113 and 117 from each other, and thus, the memory element 120 can be readily formed.

As a result of the anisotropic etching process, the memory element 120 may be formed to include the first magnetic pattern 112, the tunnel barrier pattern 114, and the second magnetic pattern 116 that are sequentially stacked on the lower electrode 106. The first magnetic pattern 112 and the tunnel barrier pattern 114 may be formed to cover not only the top surface of the lower electrode 106 but also at least a portion of the side surface of the lower electrode 106. The second magnetic pattern 116 may be locally formed on a portion of the top surface of the tunnel barrier pattern 114. For example, the bottom surface of the second magnetic pattern 116 may have an area smaller than that of the top surface of the tunnel barrier pattern 114. In exemplary embodiments, the second magnetic pattern 116 may be formed in such a way that the whole bottom surface thereof is overlapped with the central region of the top surface of the tunnel barrier pattern 114.

As a result of the anisotropic etching process, a portion of the conductive pattern 123 may be etched to form the upper electrode 122. The upper electrode 122 may be locally formed on the top surface of the second magnetic pattern 116.

After the formation of the memory element 120, the residue layer 120r may remain on the lower interlayer insulating layer 102 and between the lower electrodes 106. In example embodiments, the residue layer 120r may include the first layer 112r containing the same material as the first magnetic pattern 112 and the second layer 114r containing the same material as the tunnel barrier pattern 114. The residue layer 120r may include at least the same material as the first magnetic pattern 112.

Referring back to FIG. 1, the upper interlayer insulating layer 124 may be formed on the structure provided with the upper electrode 122. The upper interlayer insulating layer 124 may be formed to cover the lower electrode structure LES, the memory element 120, and the upper electrode 122. Since the protection spacer 110 protrudes laterally from the side surface of the insulating spacer 108, the bottom surface 110L of the protection spacer 110 may be in contact with the upper interlayer insulating layer 124.

The upper interlayer insulating layer 124 may be formed to have a flat top surface. The upper interlayer insulating layer 124 may be formed to have a single- or multi-layered structure. For example, the upper interlayer insulating layer 124 may include at least one of an oxide layer (e.g., silicon oxide layer), a nitride layer (e.g., silicon nitride layer), and/or an oxynitride layer (e.g., silicon oxynitride layer).

The interconnection line 126 may be formed on the upper interlayer insulating layer 124. The interconnection line 126 may extend along a specific direction and may be connected to a plurality of the upper electrodes 122 arranged along the specific direction. In example embodiments, the interconnection line 126 may serve as a bit line.

In exemplary embodiments in accordance with principles of inventive concepts, the protection spacer 110 may enclose a portion of the side surface of the lower electrode 106 and protrude laterally from the side surface of the lower electrode 106 toward a direction perpendicular to the side surface of the lower electrode 106, or a direction parallel to the top surface of the substrate 100. Because of the protection spacer 110, the memory layer 121 can be prevented from being continuously deposited along the side surface of the lower electrode 106. In other words, the memory layer 121 may be formed in such a way that the portions of the memory layer 121 on the lower electrodes 106 are electrically separated from each other during its deposition step. Accordingly, by etching only the second magnetic layer 117 in a subsequent anisotropic etching process, it is possible to readily form a plurality of the memory elements 120 that are electrically separated from each other. As a result, a highly reliable magnetic memory device can be readily fabricated.

Figure 12:
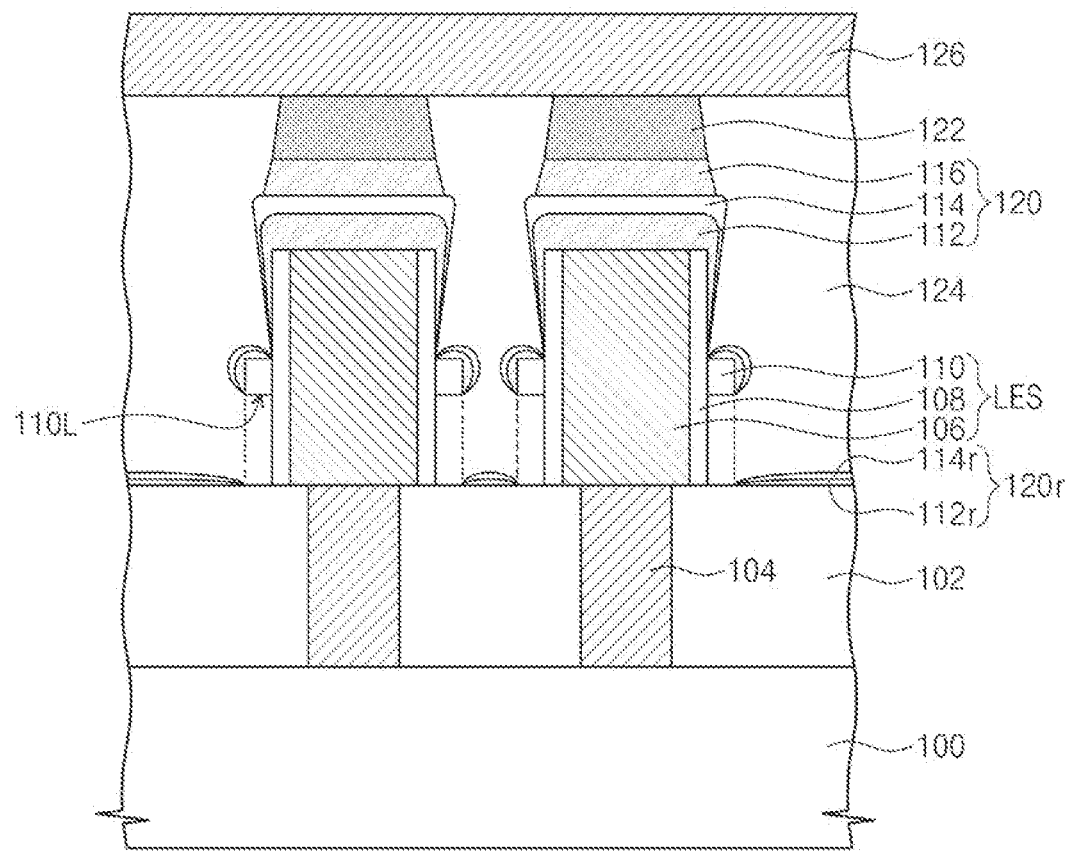
FIG. 12 is a sectional view illustrating a magnetic memory device according to a second exemplary embodiment in accordance with principles of inventive concepts.
Figure 13:
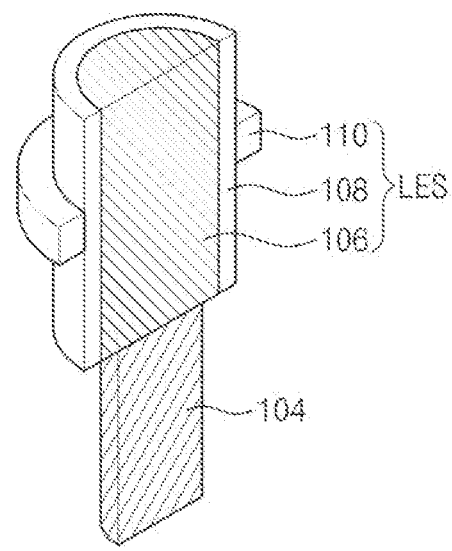
FIG. 13 is a perspective view illustrating a lower electrode structure according to the second exemplary embodiment in accordance with principles of inventive concepts.

FIG. 12 is a sectional view illustrating a magnetic memory device according to a second exemplary embodiment in accordance with principles of inventive concepts. FIG. 13 is a perspective view illustrating a lower electrode structure according to the second embodiment of the inventive concept. In the following description, the elements previously described with reference to FIGS. 1 through 3, 4A, and 4B may be identified by the similar or identical reference numbers without repeating an overlapping description thereof, for the sake of brevity.

Referring to FIGS. 12 and 13, the lower interlayer insulating layer 102 may be provided on the substrate 100. The lower contact plug 104 may be provided in the lower interlayer insulating layer 102 to penetrate the lower interlayer insulating layer 102.

The lower electrode 106 may be provided on the lower interlayer insulating layer 102. The bottom surface of the lower electrode 106 may be in contact with the top surface of the lower contact plug 104. In example embodiments, as shown in FIG. 13, the lower electrode 106 may be shaped like a pillar. The insulating spacer 108 may be provided to enclose the side surface of the lower electrode 106. In example embodiments, the insulating spacer 108 may enclose the whole side surface of the lower electrode 106. The lower electrode 106, alone or along with the insulating spacer 108, may be provided to cover the whole top surface of the lower contact plug 104. The top surface of the insulating spacer 108 may be substantially coplanar with that of the lower electrode 106. The bottom surface of the insulating spacer 108 may be substantially coplanar with that of the lower electrode 106.

A protection spacer 110 may be provided to partially enclose a side surface of the insulating spacer 108. In example embodiments, the lower electrode 106, the insulating spacer 108, and the protection spacer 110 may constitute a lower electrode structure LES. The protection spacer 110 may protrude laterally from the side surface of the insulating spacer 108 toward a direction perpendicular to the side surface of the insulating spacer 108, or a direction parallel to the top surface of the substrate 100. In example embodiments, a bottom surface 110L of the protection spacer 110 may be positioned at a level higher than the bottom surface of the lower electrode 106. Unlike the first exemplary embodiment in accordance with principles of inventive concepts described with reference to FIGS. 1 and 2, according to the present embodiment, the top surface of the protection spacer 110 opposite the bottom surface 110L of the protection spacer 110 may be positioned at a level lower than that of the top surface of the lower electrode 106.

The memory element 120 may be provided on the lower electrode 106. In example embodiments, the memory element 120 may be a magnetic tunnel junction pattern. For example, the memory element 120 may include the first magnetic pattern 112, the tunnel barrier pattern 114, and the second magnetic pattern 116 sequentially stacked on the lower electrode 106.

The first magnetic pattern 112 may cover not only the top surface of the lower electrode 106 but also a portion of the side surface of the lower electrode 106. For example, the first magnetic pattern 112 may cover the top surfaces of the lower electrode 106 and the insulating spacer 108 and may enclose a portion of the side surface of the insulating spacer 108.

Further, the first magnetic pattern 112 may extend to the top and side surfaces of the protection spacer 110 and may enclose at least a portion of the side surface of the protection spacer 110.

The tunnel barrier pattern 114 may be provided on the top surface of the first magnetic pattern 112. The tunnel barrier pattern 114 may cover the top surface of the lower electrode 106 and include a portion extending along and enclosing the side surface of the lower electrode 106. For example, the tunnel barrier pattern 114 may cover the top surfaces of the lower electrode 106 and the insulating spacer 108 and may enclose a portion of the side surface of the insulating spacer 108, the top surface of the protection spacer 110, and a portion of the side surface of the protection spacer 110.

The second magnetic pattern 116 may be locally provided on a portion of the top surface of the tunnel barrier pattern 114. For example, the second magnetic pattern 116 may have a bottom surface, whose area is smaller than that of the top surface of the tunnel barrier pattern 114. In exemplary embodiments, the whole bottom surface of the second magnetic pattern 116 may be overlapped with a central region of the top surface of the tunnel barrier pattern 114.

An upper electrode 122 may be provided on the memory element 120. The upper electrode 122 may be locally provided on the top surface of the second magnetic pattern 116.

In the present embodiment, when viewed in a plan view, the top surface of the lower electrode 106 may be shaped like a circle. Accordingly, when viewed in a plan view, the protection spacer 110 may be shaped like a circular ring.

The residue layer 120r may remain on the lower interlayer insulating layer 102 and between the lower electrodes 106. In example embodiments, the residue layer 120r may include at least a magnetic material. For example, the residue layer 120r may include the first layer 112r containing the same material as the first magnetic pattern 112 and the second layer 114r containing the same material as the tunnel barrier pattern 114.

The upper interlayer insulating layer 124 may be provided on the lower interlayer insulating layer 102 to cover the lower electrode structure LES, the memory element 120, and the upper electrode 122. Since the protection spacer 110 protrudes laterally from the side surface of the insulating spacer 108, the bottom surface 110L of the protection spacer 110 may be in contact with the upper interlayer insulating layer 124.

The interconnection line 126 may be provided on the upper interlayer insulating layer 124. The interconnection line 126 may extend along a specific direction. The interconnection line 126 may be connected to a plurality of the upper electrodes 122 arranged along the specific direction.

FIGS. 14 through 20 are sectional views illustrating a method of fabricating the magnetic memory device according to the second exemplary embodiment in accordance with principles of inventive concepts. In the following description, the elements or the fabrication steps previously described with reference to FIGS. 5 through 11 may be identified by the similar or identical reference numbers without repeating an overlapping description thereof, for the sake of brevity.

Figure 14:
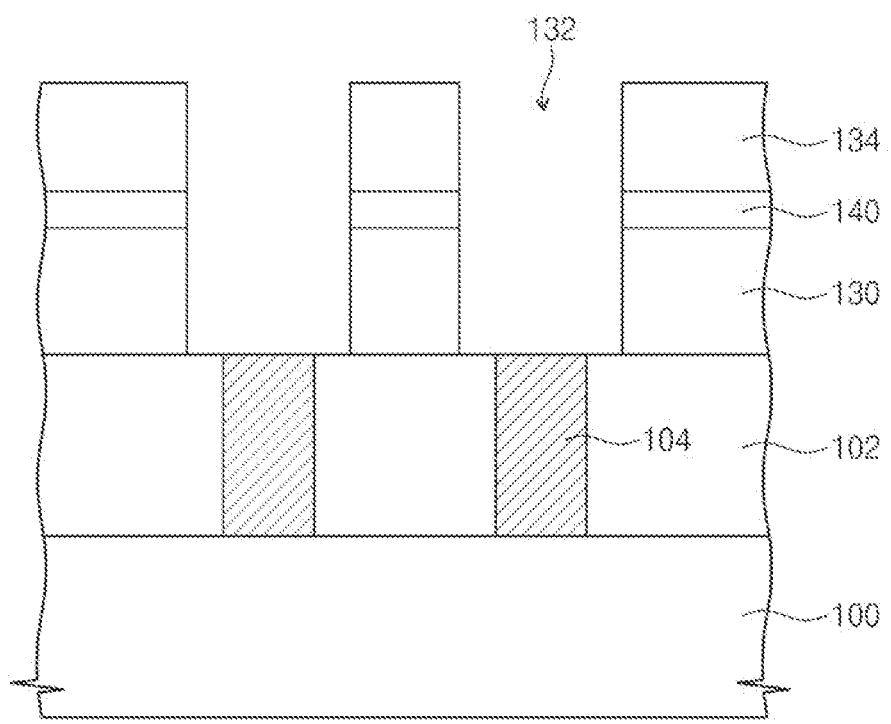
FIGS. 14 through 20 are sectional views illustrating a method of fabricating the magnetic memory device according to the second exemplary embodiment in accordance with principles of inventive concepts.

Referring to FIG. 14, the lower interlayer insulating layer 102 may be formed on the substrate 100, and the lower contact plug 104 may be formed to penetrate the lower interlayer insulating layer 102. The first mold layer 130, an intermediate layer 140, and the second mold layer 134 may be sequentially formed on the lower interlayer insulating layer 102. In example embodiments, the first and second mold layers 130 and 134 may be formed of a silicon oxide layer, and the intermediate layer 140 may be fanned of a silicon nitride layer.

The first mold layer 130, the intermediate layer 140, and the second mold layer 134 may be patterned to form the opening 132 exposing the lower contact plug 104. In example embodiments, the opening 132 may be formed to have a hole-shaped structure.

Figure 15:
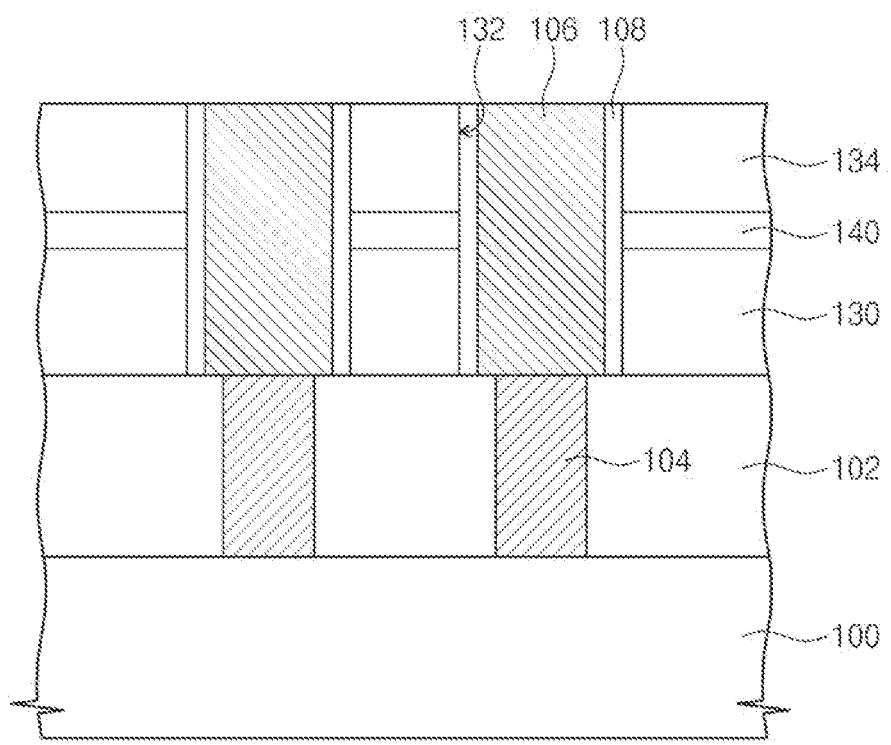

Referring to FIG. 15, the insulating spacer 108 may be formed on the inner side surface of the opening 132. In exemplary embodiments, the insulating spacer 108 may be formed to expose the lower contact plug 104. For example, the formation of the insulating spacer 108 may include conformally forming an insulating layer on the substrate 100 with the opening 132.

In other words, the insulating layer may be formed to incompletely fill the opening 132. Thereafter, the insulating layer may be etched to expose the top surfaces of the second mold layer 134 and the lower contact plug 104. Accordingly, the insulating spacer 108 may be locally fowled on the inner side surface of the opening 132.

Next, a conductive layer may be formed to fill the opening 132. The conductive layer may be planarized to expose the second mold layer 134, and thus, the lower electrode 106 may be locally formed in the opening 132.

Figure 16:
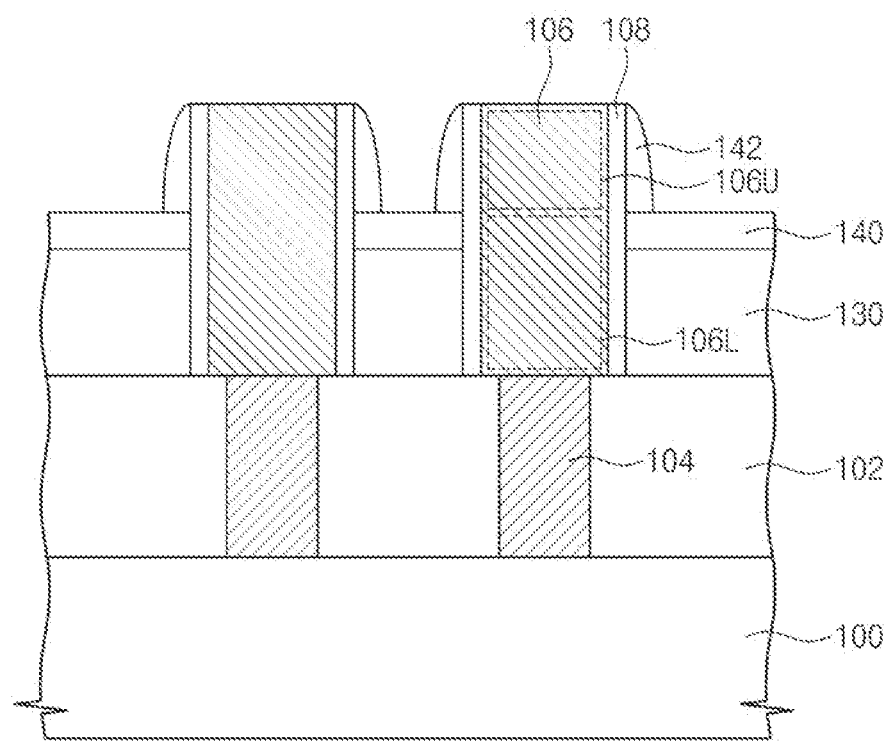

Referring to FIG. 16, the second mold layer 134 may be removed. The removal of the second mold layer 134 may be performed using an etching process having a etch selectivity with respect to the insulating spacer 108, the lower electrode 106, and the intermediate layer 140. For example, the removal of the second mold layer 134 may be removed by, for example, a wet etching process. As a result of the removal of the second mold layer 134, a portion of the outer side surface of the insulating spacer 108 may be exposed.

After the removal of the second mold layer 134, the lower electrode 106 may have a lower portion 106L, which is covered with the first mold layer 130 and the intermediate layer 140, and the upper portion 106U, which is not covered by the first mold layer 130 and the intermediate layer 140. The insulating spacer 108 may include a lower portion interposed between the lower portion 106L and the first mold layer 130 and between the lower portion 106L and the intermediate layer 140. By contrast, an upper portion of the insulating spacer 108 may not be enclosed by the first mold layer 130 and the intermediate layer 140 and may be exposed.

A sacrificial spacer 142 may be formed on the exposed outer side surface of the insulating spacer 108. For example, the formation of the sacrificial spacer 142 may include conformally forming a sacrificial layer on the structure, in which the second mold layer 134 is removed, and then, etching the sacrificial layer to expose the top surfaces of the intermediate layer 140 and the lower electrode 106. The etching of the sacrificial layer may be performed using, for example, an etch-back process. Accordingly, the sacrificial spacer 142 may be locally formed on the exposed outer side surface of the insulating spacer 108. In other words, the sacrificial spacer 142 may be formed to enclose the upper portion 106U of the lower electrode 106, and the insulating spacer 108 may be interposed between the upper portion 106U of the lower electrode 106 and the sacrificial spacer 142.

The sacrificial spacer 142 may be formed of a material having a etch selectivity with respect to the intermediate layer 140. For example, the sacrificial spacer 142 may be formed of silicon oxide, and the intermediate layer 140 may be formed of silicon nitride.

Figure 17:
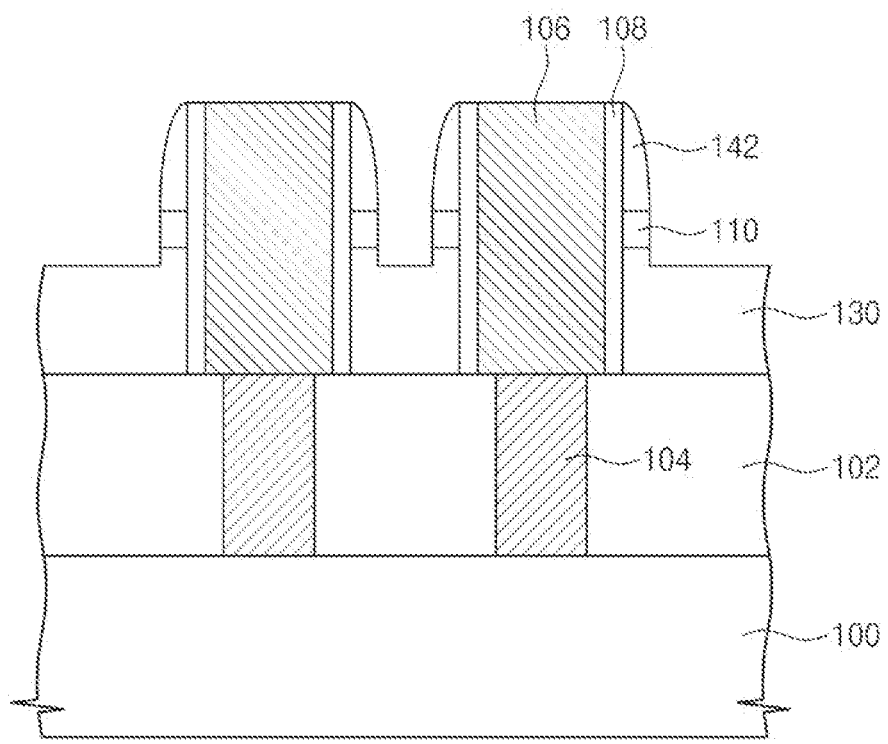

Referring to FIG. 17, the intermediate layer 140 may be patterned using the sacrificial spacer 142 as an etch mask to form the protection spacer 110. The patterning of the intermediate layer 140 may be performed using, for example, a dry etching process. In exemplary embodiments, a top portion of the first mold layer 130 may be over-etched during the etching of the intermediate layer 140.

Figure 18:
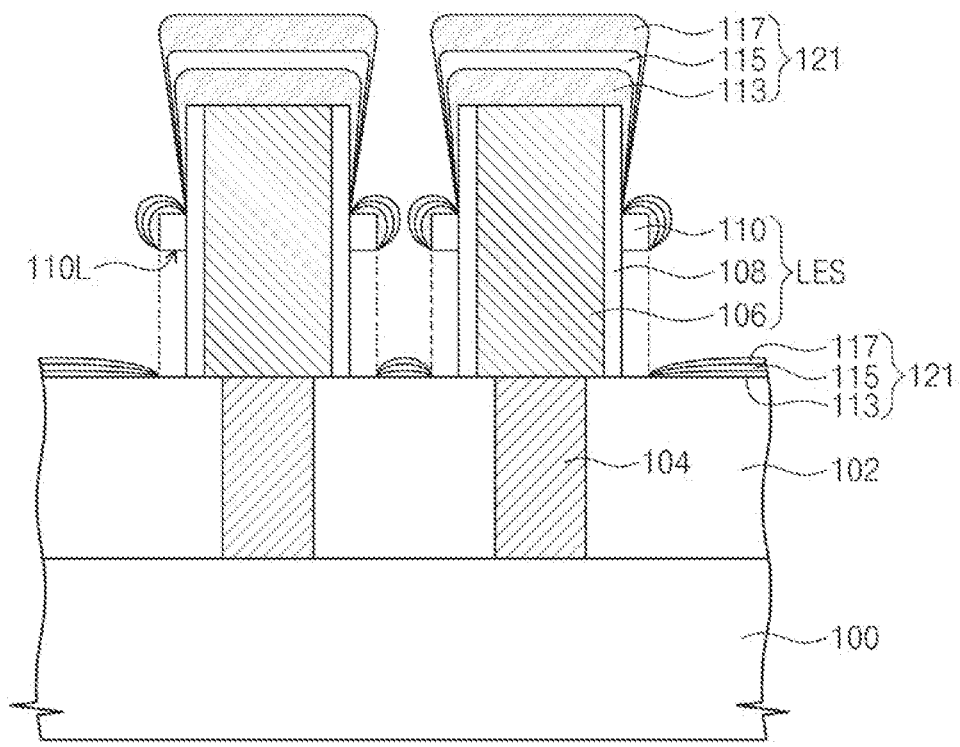

Referring to FIG. 18, the sacrificial spacer 142 and the first mold layer 130 may be removed. The removal of the sacrificial spacer 142 and the first mold layer 130 may be performed using an etching process having a etch selectivity with respect to the insulating spacer 108, the protection spacer 110, and the lower electrode 106. In exemplary embodiments, the removal of the sacrificial spacer 142 and the first mold layer 130 may be performed using, for example, a wet etching process. As a result of the removal of the sacrificial spacer 142 and the first mold layer 130, the lower electrode structure LES may be exposed. The lower electrode structure LES may include the lower electrode 106, the insulating spacer 108, and the protection spacer 110.

Thereafter, the memory layer 121 may be formed on the structure provided with the lower electrode structure LES. The memory layer 121 may be formed to cover the top surface and a portion of the side surface of the lower electrode 106. The memory layer 121 may be in contact with the top surface of the lower electrode 106. By contrast, the insulating spacer 108 may be interposed between the memory layer 121 and the side surface of the lower electrode 106, and thus, the memory layer 121 may not be in contact with the side surface of the lower electrode 106. In addition, the memory layer 121 may cover the top surface of the protection spacer 110 and/or a portion of the side surface of the protection spacer 110.

Since the protection spacer 110 has a shape protruding laterally from the outer side surface of the insulating spacer, the memory layer 121 may not be continuously deposited along the side surface of the lower electrode 106. For example, the memory layer 121 may not be formed on the bottom surface 110L of the protection spacer 110. In addition, the memory layer 121 may not be formed on at least a portion of the lower interlayer insulating layer 102, which is overlapped with the protection spacer 110 when viewed in a plan view. In other words, the memory layer 121 may be formed in such a way that the portions of the memory layer 121 on the lower electrodes 106 can be electrically separated from each other during its deposition step.

Figure 19:
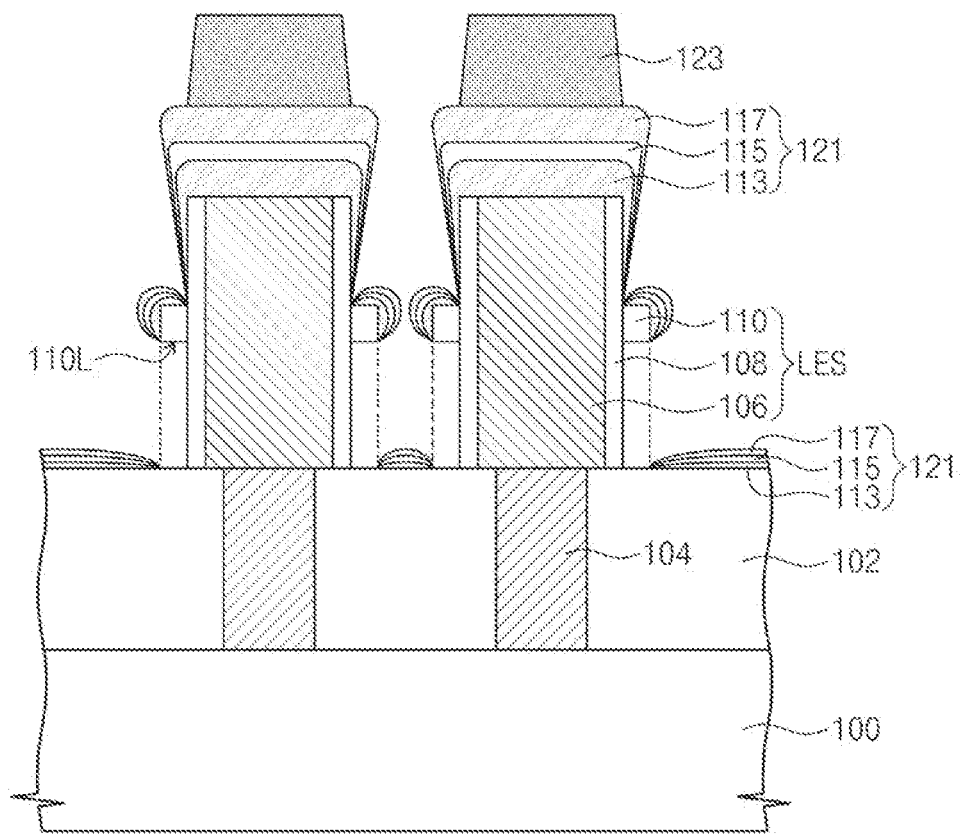

Referring to FIG. 19, the conductive pattern 123 may be formed on the structure provided with the memory layer 121. The conductive pattern 123 may be locally formed on the memory layer 121 provided on the lower electrode 106. For example, the conductive pattern 123 may be locally provided on the top surface of the lower electrode 106. Accordingly, the conductive pattern 123 may be formed to expose a portion of the memory layer 121 provided on the side surface of the lower electrode 106.

Figure 20:
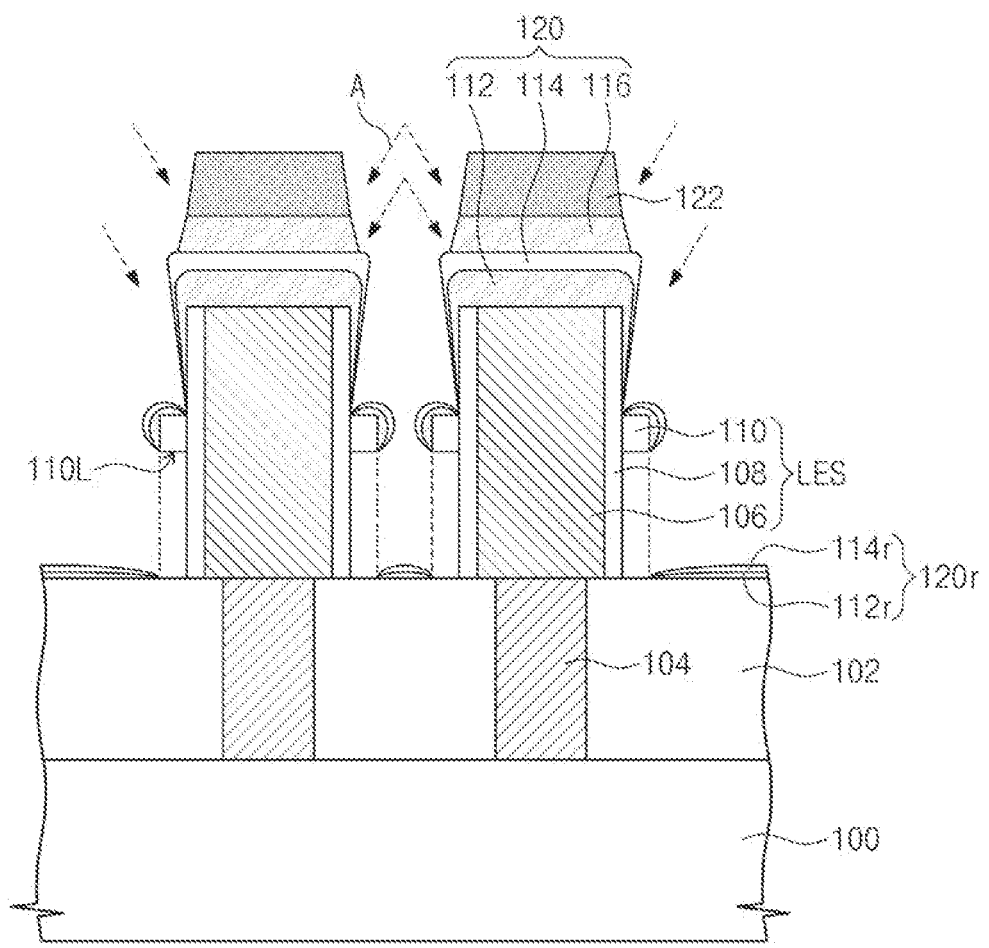

Referring to FIG. 20, the exposed portion of the memory layer 121 may be etched to form the memory element 120. For example, the exposed portion of the memory layer 121 may be etched by a tilted anisotropic etching process, which is performed to have an etching direction A at an angle to the top surface of the substrate 100. As a result of the anisotropic etching process, the second magnetic layer 117 may be removed from the side surface of the lower electrode 106 to expose a portion of the tunnel barrier layer 115 provided on the side surface of the lower electrode 106. Accordingly, the first and second magnetic layers 113 and 117 can be electrically separated from each other.

As a result of the anisotropic etching process, the memory element 120 may be formed to include the first magnetic pattern 112, the tunnel barrier pattern 114, and the second magnetic pattern 116 that are sequentially stacked on the lower electrode 106. The first magnetic pattern 112 and the tunnel barrier pattern 114 may cover not only the top surface of the lower electrode 106 but also a portion of the side surface of the lower electrode 106. In addition, the first magnetic pattern 112 and the tunnel barrier pattern 114 may cover the top surface of the protection spacer 110 and/or a portion of the side surface of the protection spacer 110. The second magnetic pattern 116 may cover the top surface of the lower electrode 106.

As a result of the anisotropic etching process, a portion of the conductive pattern 123 may be etched to form the upper electrode 122. The upper electrode 122 may be locally formed on the top surface of the second magnetic pattern 116.

After the formation of the memory element 120, the residue layer 120r may remain on the lower interlayer insulating layer 102 and between the lower electrodes 106. In example embodiments, the residue layer 120r may include a first layer 112r containing the same material as the first magnetic pattern 112 and a second layer 114r containing the same material as the tunnel barrier pattern 114.

Referring back to FIG. 12, the upper interlayer insulating layer 124 may be formed on the structure provided with the upper electrode 122. The upper interlayer insulating layer 124 may be formed to cover the lower electrode structure LES, the memory element 120, and the upper electrode 122. Since the protection spacer 110 protrudes laterally from the side surface of the insulating spacer 108, the bottom surface 110L of the protection spacer 110 may be in contact with the upper interlayer insulating layer 124.

The interconnection line 126 may be formed on the upper interlayer insulating layer 124. The interconnection line 126 may extend along a specific direction and may be connected to a plurality of the upper electrodes 122 arranged along the specific direction.

Figure 21:
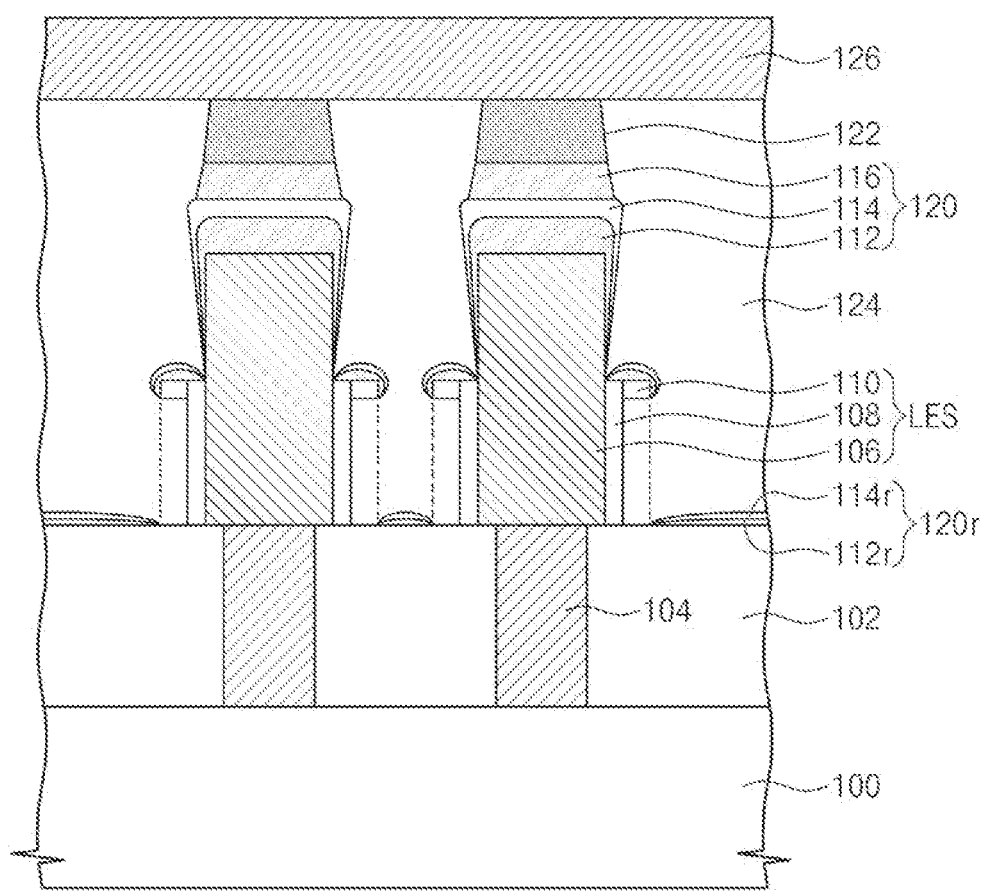
FIG. 21 is a sectional view illustrating a magnetic memory device according to a modification of the second exemplary embodiment in accordance with principles of inventive concepts.
Figure 22:
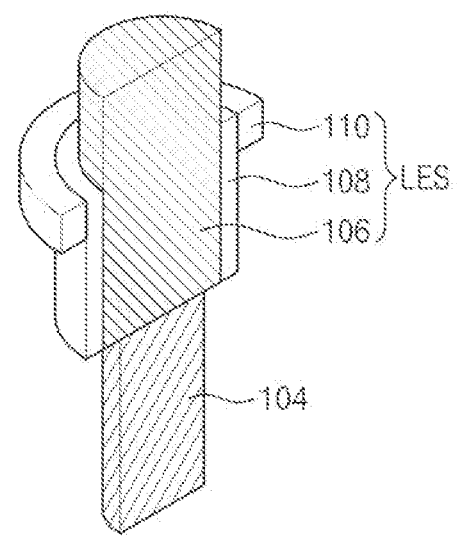
FIG. 22 is a perspective view illustrating a lower electrode structure according to a modification of the second exemplary embodiment in accordance with principles of inventive concepts.

FIG. 21 is a sectional view illustrating a magnetic memory device according to a modification of the second exemplary embodiment in accordance with principles of inventive concepts. FIG. 22 is a perspective view illustrating a lower electrode structure according to a modification of the second exemplary embodiment in accordance with principles of inventive concepts. In the following description, the elements previously described with reference to FIGS. 12 and 13 may be identified by the similar or identical reference numbers without repeating an overlapping description thereof, for the sake of brevity.

Referring to FIGS. 21 and 22, the lower electrode 106 may be disposed on the lower interlayer insulating layer 102. The bottom surface of the lower electrode 106 may be contact with the top surface of the lower contact plug 104 penetrating the lower interlayer insulating layer 102.

In example embodiments, as shown in FIG. 22, the lower electrode 106 may be shaped like a pillar. The insulating spacer 108 may be provided to enclose a portion of the side surface of the lower electrode 106. The top surface of the insulating spacer 108 may be located at a level lower than that of the top surface of the lower electrode 106. The bottom surface of the insulating spacer 108 may be substantially coplanar with that of the lower electrode 106.

The protection spacer 110 may be provided to partially enclose a side surface of the insulating spacer 108. The protection spacer 110 may protrude laterally from the side surface of the insulating spacer 108 toward a direction perpendicular to the side surface of the insulating spacer 108, or a direction parallel to the top surface of the substrate 100. In example embodiments, the bottom surface of the protection spacer 110 may be positioned at a level higher than that of the lower electrode 106. The top surface of the protection spacer 110 may be positioned at a level lower than that of the lower electrode 106. The top surface of the protection spacer 110 may be positioned at substantially the same level as that of the insulating spacer 108.

The memory element 120 may be provided on the lower electrode 106. For example, the memory element 120 may include the first magnetic pattern 112, the tunnel barrier pattern 114, and the second magnetic pattern 116 sequentially stacked on the lower electrode 106.

The first magnetic pattern 112 and the tunnel barrier pattern 114 may cover not only the top surface of the lower electrode 106 but also a portion of the side surface of the lower electrode 106. In the present embodiment, the first magnetic pattern 112 may be in direct contact with the side surface of the lower electrode 106. In addition, the first magnetic pattern 112 and the tunnel barrier pattern 114 may extend to the top and side surfaces of the protection spacer 110 and may enclose at least a portion of the side surface of the protection spacer 110. The second magnetic pattern 116 may be locally formed on the top surface of the tunnel barrier pattern 114. For example, the second magnetic pattern 116 may be locally provided on the top surface of the lower electrode 106.

Figure 23:
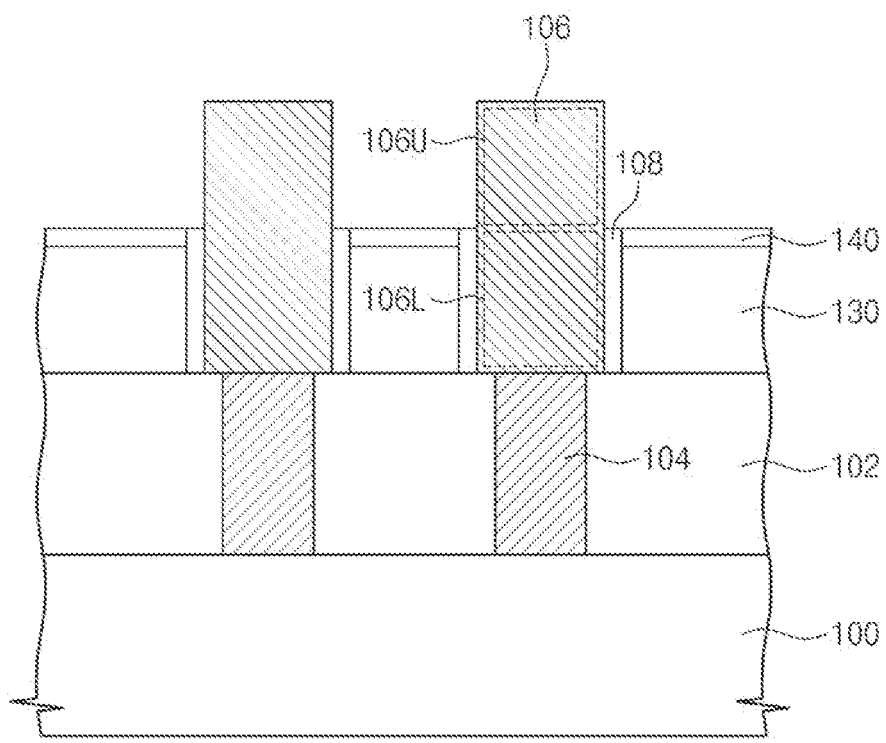
FIGS. 23 through 25 are sectional views illustrating a method of fabricating the magnetic memory device according to the modification of the second exemplary embodiment in accordance with principles of inventive concepts.
Figure 24:
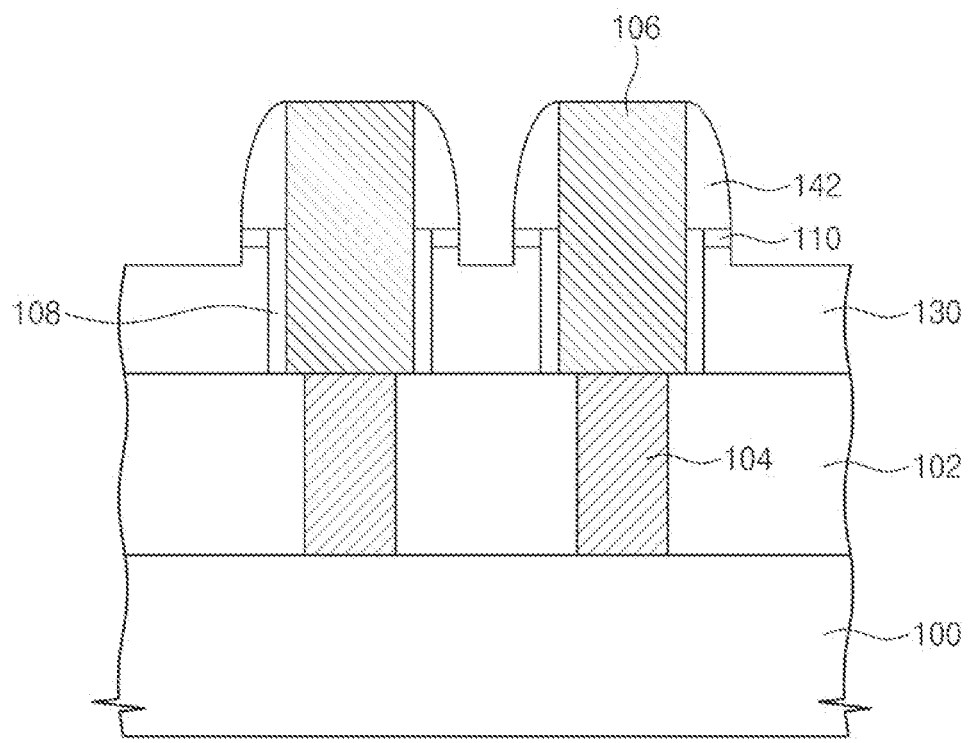
Figure 25:
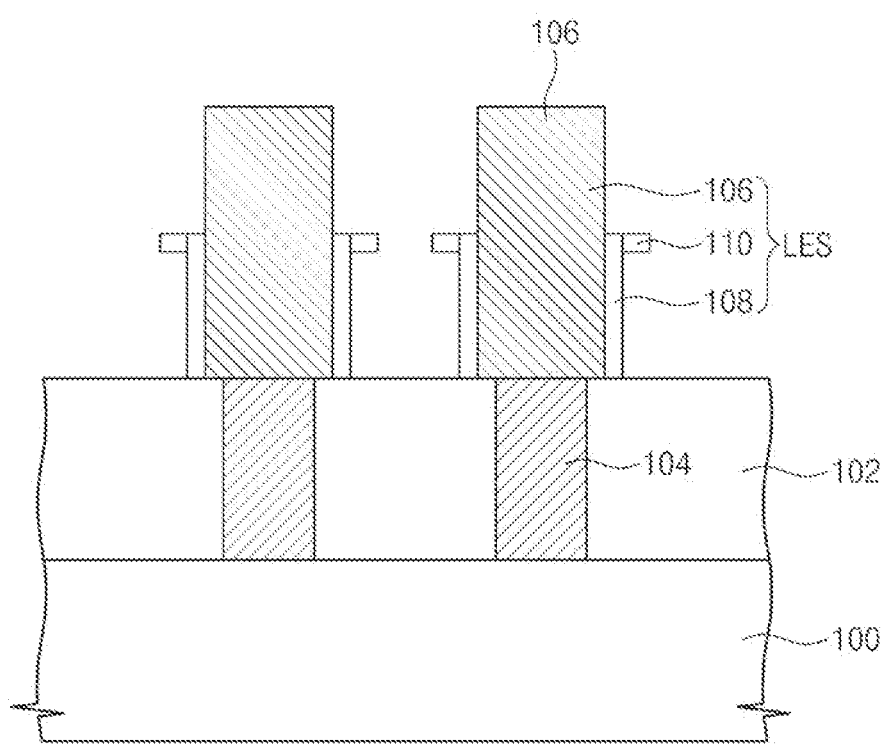

FIGS. 23 through 25 are sectional views illustrating a method of fabricating the magnetic memory device according to the modification of the second exemplary embodiment in accordance with principles of inventive concepts. In the following description, an element or a fabrication step previously described with reference to FIGS. 14 through 20 may be identified by a similar or identical reference number without repeating an overlapping description thereof, for the sake of brevity.

As described with reference to FIGS. 14 through 16, the lower interlayer insulating layer 102 may be formed on the substrate 100, and the lower contact plug 104 may be formed to penetrate the lower interlayer insulating layer 102. The first mold layer 130, the intermediate layer 140, and the second mold layer 134 may be sequentially formed on the lower interlayer insulating layer 102. The first mold layer 130, the intermediate layer 140, and the second mold layer 134 may be patterned to form the opening 132 exposing the lower contact plug 104.

The insulating spacer 108 may be locally formed on the inner side surface of the opening 132, and the lower electrode 106 may be formed to fill the opening 132. Thereafter, the second mold layer 134 may be removed. As a result of the removal of the second mold layer 134, a portion of the outer side surface of the insulating spacer 108 may be exposed. For example, the insulating spacer 108 may include a lower portion interposed between the lower portion 106L of the lower electrode 106 and the first mold layer 130 and between the lower portion 106L of the lower electrode 106 and the intermediate layer 140, and an upper portion of the insulating spacer 108 may not be enclosed by the first mold layer 130 and the intermediate layer 140 and may be exposed.

Referring to FIG. 23, the exposed portion of the insulating spacer 108 may be removed to expose the side surface of the upper portion 106U of the lower electrode 106. The removal of the exposed portion of the insulating spacer 108 may be performed using an etching process having a etch selectivity with respect to the lower electrode 106. During the etching process, a top portion of the intermediate layer 140 may be etched.

Referring to FIG. 24, the sacrificial spacer 142 may be formed on the exposed side surface of the upper portion 106U of the lower electrode 106. The sacrificial spacer 142 may be formed to enclose the upper portion 106U of the lower electrode 106 and may be in direct contact with the side surface of the upper portion 106U of the lower electrode 106.

The intermediate layer 140 may be patterned using the sacrificial spacer 142 as an etch mask to form the protection spacer 110. The patterning of the intermediate layer 140 may be performed using, for example, a dry etching process. In exemplary embodiments, a top portion of the first mold layer 130 may be over-etched during the etching of the intermediate layer 140.

Referring to FIG. 25, the sacrificial spacer 142 and the first mold layer 130 may be removed. The removal of the sacrificial spacer 142 and the first mold layer 130 may be performed using an etching process having a etch selectivity with respect to the insulating spacer 108, the protection spacer 110, and the lower electrode 106. As a result of the removal of the sacrificial spacer 142 and the first mold layer 130, the lower electrode structure LES may be exposed. The lower electrode structure LES may include the lower electrode 106, the insulating spacer 108, and the protection spacer 110.

A subsequent process may be performed in the same manner as the fabricating method described with reference to FIGS. 18 through 20.

Figure 26:
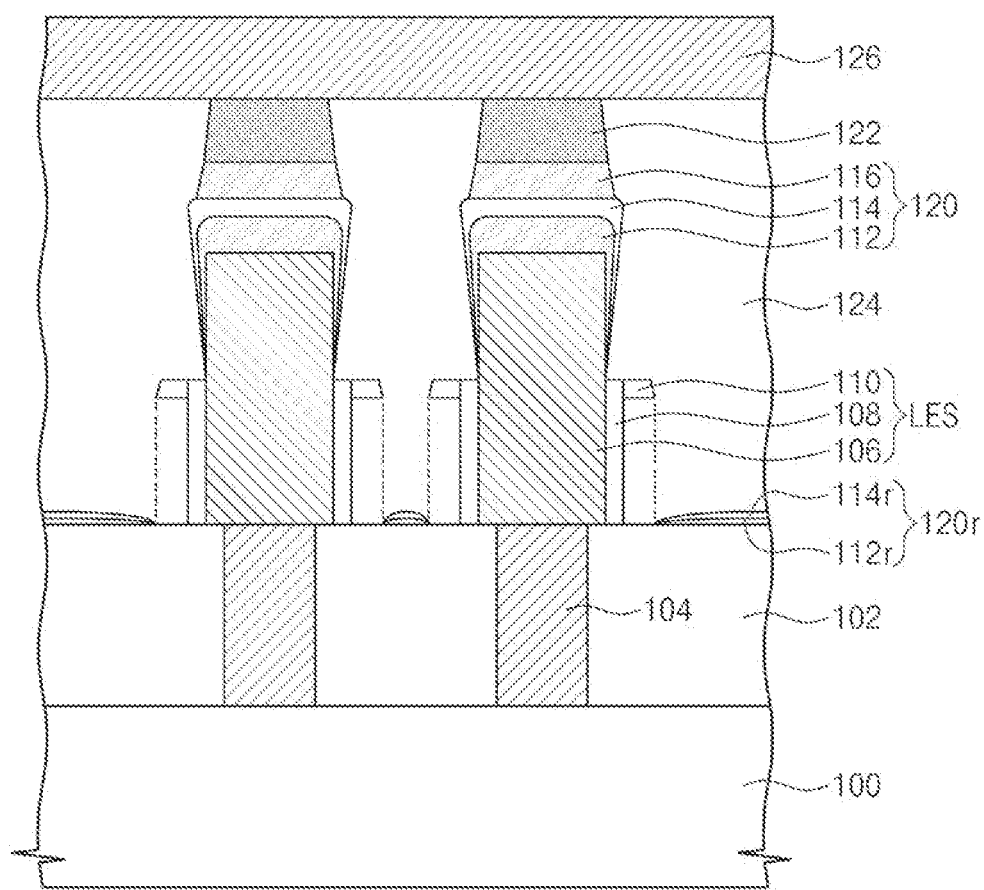
FIG. 26 is a sectional view illustrating a magnetic memory device according to other modification of the second exemplary embodiment in accordance with principles of inventive concepts.

FIG. 26 is a sectional view illustrating a magnetic memory device according to other modification of the second exemplary embodiment in accordance with principles of inventive concepts. In the following description, the elements previously described with reference to FIGS. 12 and 13 may be identified by the similar or identical reference numbers without repeating an overlapping description thereof, for the sake of brevity.

Referring to FIG. 26, the lower electrode 106 may be disposed on the lower interlayer insulating layer 102. The bottom surface of the lower electrode 106 may be contact with the top surface of the lower contact plug 104 penetrating the lower interlayer insulating layer 102.

The insulating spacer 108 may be provided to enclose a portion of the side surface of the lower electrode 106. The top surface of the insulating spacer 108 may be located at a level lower than that of the top surface of the lower electrode 106. The bottom surface of the insulating spacer 108 may be located at substantially the same level as that of the lower electrode 106.

The protection spacer 110 may be provided to partially enclose a side surface of the insulating spacer 108. The protection spacer 110 may protrude laterally from the side surface of the insulating spacer 108 toward a direction perpendicular to the side surface of the insulating spacer 108, or a direction parallel to the top surface of the substrate 100. In example embodiments, the bottom surface of the protection spacer 110 may be positioned at a level higher than that of the lower electrode 106. The top surface of the protection spacer 110 may be positioned at a level lower than that of the lower electrode 106. The top surface of the protection spacer 110 may be positioned at substantially the same level as that of the insulating spacer 108. When viewed in a sectional view, the outer side surface of the protection spacer 110 may have a slanted profile. In other words, the bottom surface of the protection spacer 110 may have an area larger than that of the top surface of the protection spacer 110.

Figure 27:
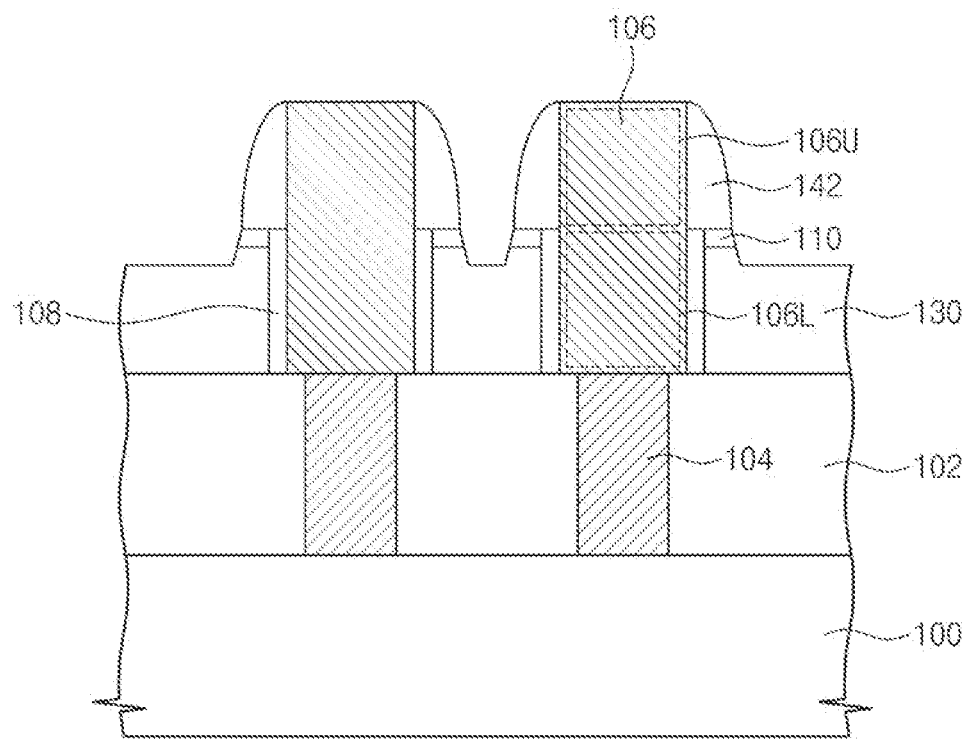
FIGS. 27 and 28 are sectional views illustrating a method of fabricating the magnetic memory device according to other modification of the second exemplary embodiment in accordance with principles of inventive concepts.
Figure 28:
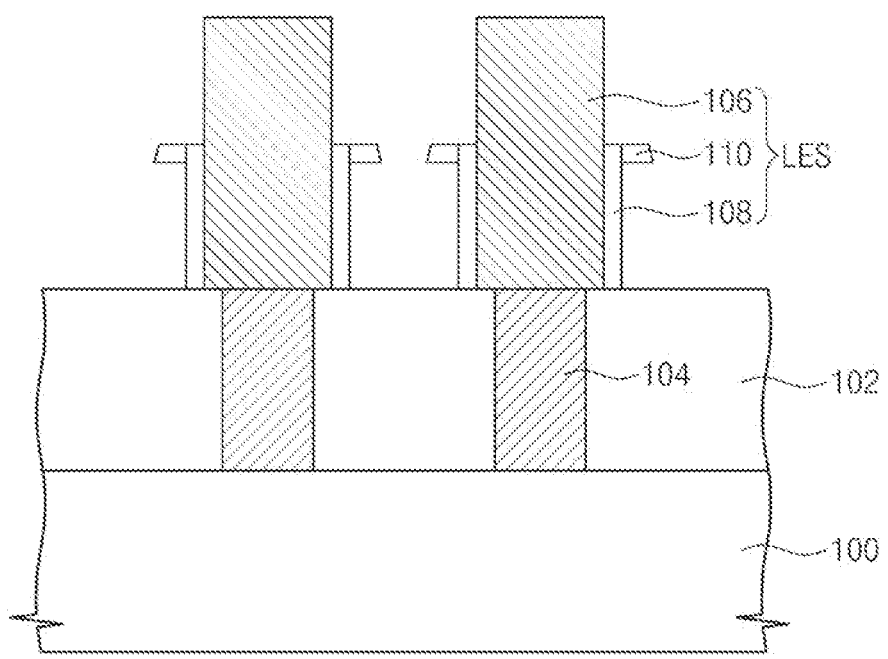

FIGS. 27 and 28 are sectional views illustrating a method of fabricating the magnetic memory device according to other modification of the second exemplary embodiment in accordance with principles of inventive concepts. In the following description, the elements or the fabrication steps previously described with reference to FIGS. 14 through 20 may be identified by the similar or identical reference numbers without repeating an overlapping description thereof, for the sake of brevity.

As described with reference to FIGS. 14 through 16, the first mold layer 130, the intermediate layer 140, and the second mold layer 134 may be sequentially formed on the lower interlayer insulating layer 102. The first mold layer 130, the intermediate layer 140, and the second mold layer 134 may be patterned to form the opening 132 exposing the lower contact plug 104. The insulating spacer 108 may be locally formed on the inner side surface of the opening 132, and the lower electrode 106 may be formed to fill the opening 132.

Thereafter, the second mold layer 134 may be removed. As a result of the removal of the second mold layer 134, a portion of the outer side surface of the insulating spacer 108 may be exposed. For example, the insulating spacer 108 may include a lower portion interposed between the lower portion 106L of the lower electrode 106 and the first mold layer 130 and between the lower portion 106L of the lower electrode 106 and the intermediate layer 140, and an upper portion of the insulating spacer 108 may not be enclosed by the first mold layer 130 and the intermediate layer 140 and may be exposed.

Referring to FIG. 27, the exposed portion of the insulating spacer 108 may be removed to expose the side surface of the upper portion 106U of the lower electrode 106. The sacrificial spacer 142 may be formed on the exposed side surface of the upper portion 106U of the lower electrode 106. The sacrificial spacer 142 may be formed to enclose the upper portion 106U of the lower electrode 106 and may be in direct contact with the side surface of the upper portion 106U of the lower electrode 106.

The intermediate layer 140 may be patterned using the sacrificial spacer 142 as an etch mask to form the protection spacer 110. When viewed in a sectional view, the outer side surface of the protection spacer 110 may have a slanted profile, depending on an etching condition of the etching process. Further, during the etching process, a top portion of the first mold layer 130 may be over-etched.

Referring to FIG. 28, the sacrificial spacer 142 and the first mold layer 130 may be removed, and thus, the lower electrode structure LES may be exposed. The lower electrode structure LES may include the lower electrode 106, the insulating spacer 108, and the protection spacer 110.

A subsequent process may be performed in the same manner as the fabricating method described with reference to FIGS. 18 through 20.

Figure 29:
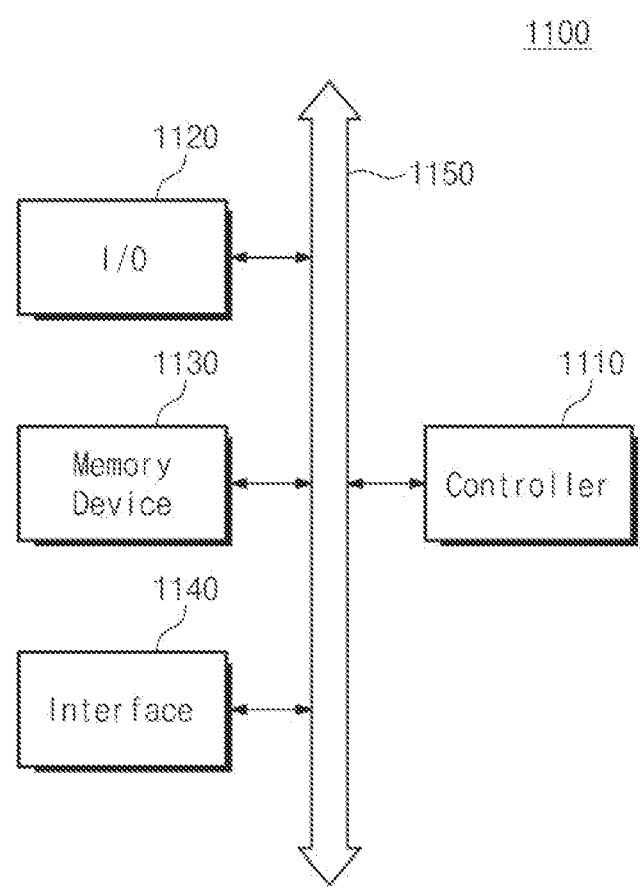
FIG. 29 is a schematic block diagram illustrating an example of electronic systems including a semiconductor device in exemplary embodiments in accordance with principles of inventive concepts.

FIG. 29 is a schematic block diagram illustrating an example of electronic systems including a semiconductor device in exemplary embodiments in accordance with principles of inventive concepts.

Referring to FIG. 29, an electronic system 1100 according to example embodiments may include a controller 1110, an input/output (I/O) unit 1120, a memory device 1130, an interface unit 1140 and a bus 1150. At least two of the controller 1110, the I/O unit 1120, the memory device 1130 and the interface unit 1140 may communicate with each other through the bus 1150. The bus 1150 may correspond to a path through which electrical signals are transmitted.

The controller 1110 may include at least one of a microprocessor, a digital signal processor, a microcontroller or another logic device. The other logic device may have a similar function to any one of the microprocessor, the digital signal processor and the microcontroller.

The I/O unit 1120 may include a keypad, a keyboard or a display unit. The memory device 1130 may store data and/or commands. The memory device 1130 may include at least one of the semiconductor memory devices according to the afore-described embodiments. The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. Although not shown in the drawings, the electronic system 1100 may further include a fast DRAM or SRAM device that acts as a cache memory for improving an operation of the controller 1110.

The electronic system 1100 may be applied to a personal digital assistant (PDA), a portable computer, a web tablet, a wireless phone, a mobile phone, a digital music player, a memory card or an electronic product. The electronic product may receive or transmit information data by wireless.

Figure 30:
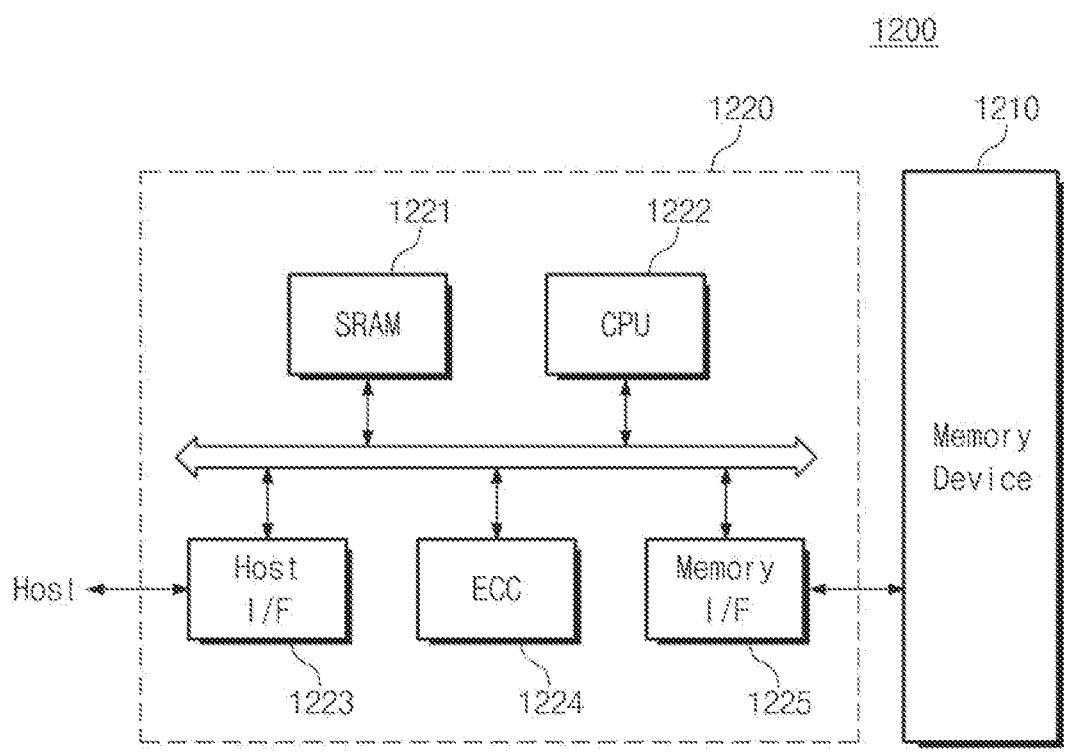
FIG. 30 is a schematic block diagram illustrating an example of memory systems including a semiconductor device in exemplary embodiments in accordance with principles of inventive concepts.

FIG. 30 is a schematic block diagram illustrating an example of memory systems including a semiconductor device in exemplary embodiments in accordance with principles of inventive concepts.

Referring to FIG. 30, a memory system 1200 in exemplary embodiments in accordance with principles of inventive concepts may include a memory device 1210. The memory device 1210 may include at least one of the semiconductor memory devices according to the afore-described embodiments. The memory system 1200 may include a memory controller 1220 that controls data communication between a host and the memory device 1210.

The memory controller 1220 may include a central processing unit (CPU) 1222 that controls overall operations of the memory system 1200. In addition, the memory controller 1220 may include an SRAM device 1221 used as an operation memory of the CPU 1222. Moreover, the memory controller 1220 may further include a host interface unit 1223 and a memory interface unit 1225. The host interface unit 1223 may be configured to include a data communication protocol between the memory system 1200 and the host. The memory interface unit 1225 may connect the memory controller 1220 to the memory device 1210. The memory controller 1220 may further include an error check and correction (ECC) block 1224. The ECC block 1224 may detect and correct errors of data which are read out from the memory device 1210. Even though not shown in the drawings, the memory system 1200 may further include a read only memory (ROM) device that stores code data to interface with the host. The memory system 1200 may be used as a portable data storage card. The memory system 1200 may include the memory card or hard disk of computer system as solid state disk (SSD) of the computer system.

In exemplary embodiments in accordance with principles of inventive concepts, the protection spacer may enclose a portion of the side surface of the lower electrode and may protrude laterally from the side surface of the lower electrode toward a direction perpendicular to the side surface of the lower electrode, or a direction parallel to the top surface of the substrate 100, and thus, the memory layer may not be continuously deposited along the side surface of the lower electrode. In other words, the memory layer may be formed in such a way that its portions positioned on the lower electrodes are electrically separated from each other during its deposition process. Accordingly, it is possible to readily form a plurality of the memory elements that are provided on the lower electrodes, respectively, and are electrically separated from each other. This makes it possible to readily fabricate a highly reliable magnetic memory device.

While example embodiments of the inventive concepts have been particularly shown and described, it will be understood by one of ordinary skill in the art that variations in form and detail may be made therein without departing from the spirit and scope of the attached claims.

What is claimed is:

1. A magnetic memory device, comprising:
 a lower electrode on a substrate;
 a memory element on the lower electrode;
 an upper electrode on the memory element; and
 a protection spacer enclosing a portion of a side surface of the lower electrode and protruding laterally from the side surface of the lower electrode
 wherein the protection spacer has a bottom surface that is positioned at a level higher than that of a bottom surface of the lower electrode.

2. The magnetic memory device of claim 1, further comprising an insulating spacer enclosing at least a portion of the side surface of the lower electrode,
 wherein the insulating spacer is located between the lower electrode and the protection spacer, and
 the protection spacer encloses a portion of a side surface of the insulating spacer and protrudes laterally from the side surface of the insulating spacer.

3. The magnetic memory device of claim 2, wherein the bottom surface of the protection spacer is positioned at a level higher than that of a bottom surface of the insulating spacer.

4. The magnetic memory device of claim 1, wherein the protection spacer has a top surface that is positioned at substantially the same level as that of a top surface of the lower electrode.

5. The magnetic memory device of claim 1, wherein the protection spacer has a top surface that is positioned at a level lower than that of a top surface of the lower electrode.

6. A magnetic memory device, comprising:
 a lower electrode on a substrate;
 a memory element on the lower electrode, the memory element including a first magnetic pattern, a tunnel barrier pattern, and a second magnetic pattern sequentially stacked on the lower electrode;
 an upper electrode on the memory element; and
 a protection spacer enclosing a portion of a side surface of the lower electrode and protruding laterally from the side surface of the lower electrode,
 wherein the first magnetic pattern and the tunnel barrier pattern are provided to cover not only a top surface of the lower electrode but also a portion of the side surface of the lower electrode, and
 wherein the protection spacer has a bottom surface that is positioned at a level higher than that of a bottom surface of the lower electrode.

7. The magnetic memory device of claim 6, wherein the second magnetic pattern is located on the top surface of the tunnel barrier pattern, and
 an area of a bottom surface of the second magnetic pattern is smaller than that of a top surface of the tunnel barrier pattern.

8. The magnetic memory device of claim 6, further comprising an insulating layer covering the lower electrode, the memory element, and protection layer,
 wherein the protection spacer is located between the side surface of the lower electrode and the first magnetic pattern, and
 the bottom surface of the protection spacer is in contact with the insulating layer.

9. The magnetic memory device of claim 8, wherein the first magnetic pattern and the tunnel barrier pattern are provided to cover at least a portion of a top surface of the protection spacer and at least a portion of a side surface of the protection spacer.

10. The magnetic memory device of claim 8, further comprising an insulating spacer enclosing the side surface of the lower electrode,
wherein the insulating spacer is located between the protection spacer and the lower electrode, and
the lower electrode, the insulating spacer, and the protection spacer have top surfaces that are coplanar with each other.

11. The magnetic memory device of claim 8, further comprising an insulating spacer enclosing the side surface of the lower electrode,
wherein the insulating spacer is located between the protection spacer and the lower electrode,
the insulating spacer has a top surface coplanar with the top surface of the lower electrode, and
the protection spacer has a top surface positioned at a level lower than that of the top surface of the lower electrode.

12. The magnetic memory device of claim 8, further comprising an insulating spacer enclosing the side surface of the lower electrode,
wherein the insulating spacer is located between the protection spacer and the lower electrode,
the insulating spacer has a top surface coplanar with a top surface of the protection spacer, and
the top surface of the protection spacer is positioned at a level lower than that of the top surface of the lower electrode.

13. The magnetic memory device of claim 6, wherein one of the first and second magnetic patterns has a magnetization direction fixed to a specific direction, and the other has a magnetization direction that can be changed to be parallel or antiparallel to the specific direction.

14. The magnetic memory device of claim 13, wherein the first magnetic pattern is in direct contact with the side surface of the lower electrode.

15. The magnetic memory device of claim 13, wherein the protection spacer includes a slanted outer side surface.

16. A magnetic memory device, comprising:
a first insulating layer on a substrate;
lower electrodes spaced apart from each other on the first insulating layer;
memory elements disposed on the lower electrodes, respectively; upper electrodes disposed on the memory elements, respectively;
protection spacers enclosing side surfaces of the lower electrodes, respectively; and
a residue layer disposed on the first insulating layer and between the lower electrodes,
wherein the residue layer includes a magnetic material, and
wherein each of the protection spacers has a bottom surface that is positioned at a level higher than that of a bottom surface of each of the lower electrodes.

17. The magnetic memory device of claim 16, further comprising a second insulating layer disposed between the lower electrodes to cover the residue layer,
wherein the bottom surface of each of the protection spacers is in contact with the second insulating layer.

18. The magnetic memory device of claim 16, wherein each of the memory elements comprises a first magnetic pattern, a tunnel barrier pattern, and a second magnetic pattern sequentially stacked on each of the lower electrodes, and
wherein the residue layer includes at least the same magnetic material as the first magnetic pattern.

19. The magnetic memory device of claim 16, further comprising insulating spacers enclosing the side surfaces of the lower electrodes, respectively,
wherein each of the insulating spacers is located between each of the lower electrodes and each of the protection spacers, and
each of the protection spacers encloses a portion of a side surface of each of the insulating spacers.

20. The magnetic memory device of claim 19, wherein the bottom surface of each of the protection spacers is positioned at a level higher than that of a bottom surface of each of the insulating spacers.

* * * * *